(12) United States Patent
Lin et al.

(10) Patent No.: US 11,955,385 B2
(45) Date of Patent: Apr. 9, 2024

(54) SEMICONDUCTOR DEVICES WITH DIELECTRIC PASSIVATION LAYER AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Chih-Han Lin, Hsinchu (TW); Chen-Ping Chen, Toucheng Township (TW); Hsiao Wen Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 232 days.

(21) Appl. No.: 17/459,865

(22) Filed: Aug. 27, 2021

(65) Prior Publication Data

US 2023/0060742 A1    Mar. 2, 2023

(51) Int. Cl.
*H01L 21/8234* (2006.01)
*B82Y 10/00* (2011.01)
*H01L 27/088* (2006.01)
*H01L 29/06* (2006.01)
*H01L 29/423* (2006.01)
(Continued)

(52) U.S. Cl.
CPC ........... *H01L 21/823481* (2013.01); *H01L 21/823418* (2013.01); *H01L 27/088* (2013.01)

(58) Field of Classification Search
CPC ........... H01L 29/0673; H01L 29/42392; H01L 29/78696; H01L 29/785; H01L 29/41791; H01L 21/823418; H01L 29/0843–0891; H01L 29/66636; H01L 21/823814; H01L 21/823481; H01L 29/6681; H01L 27/0886; H01L 29/0847; H01L 29/1029; H01L 29/66795; H01L 29/7851; H01L 21/762; H01L 29/7843; H01L 29/66439; H01L 29/775; H01L 21/76224–76237; H01L 21/823878; H01L 29/0649–0653; H01L 29/7855; H01L 29/7831; B82Y 10/00

See application file for complete search history.

(56) References Cited

U.S. PATENT DOCUMENTS 10,332,999 B1 *    6/2019    Cheng ................... H01L 29/161
2018/0108656 A1 *    4/2018    Lin ...................... H01L 29/66795
(Continued)

*Primary Examiner* — Sonya McCall-Shepard
(74) *Attorney, Agent, or Firm* — FOLEY & LARDNER LLP

(57) ABSTRACT

A semiconductor device includes a first stack structure, a second stack structure, and a third stack structure. Each of the stack structure includes semiconductor layers vertically spaced from one another. The first, second, and third stack structures all extend along a first lateral direction. The second stack structure is disposed between the first and third stack structures. The semiconductor device includes a first gate structure that extends along a second lateral direction and wraps around each of the semiconductor layers. The semiconductor layers of the first stack structure are coupled with respective source/drain structures. The semiconductor layers of the second stack structure are coupled with respective source/drain structures. The semiconductor layers of the third stack structure are coupled with a dielectric passivation layer.

20 Claims, 35 Drawing Sheets

(51) Int. Cl.
  *H01L 29/66* (2006.01)
  *H01L 29/775* (2006.01)
  *H01L 29/786* (2006.01)

(56) References Cited

U.S. PATENT DOCUMENTS

2021/0202527 A1* 7/2021 Kim .................. H01L 29/78696
2022/0344321 A1* 10/2022 Wu ......................... G06F 30/39

* cited by examiner

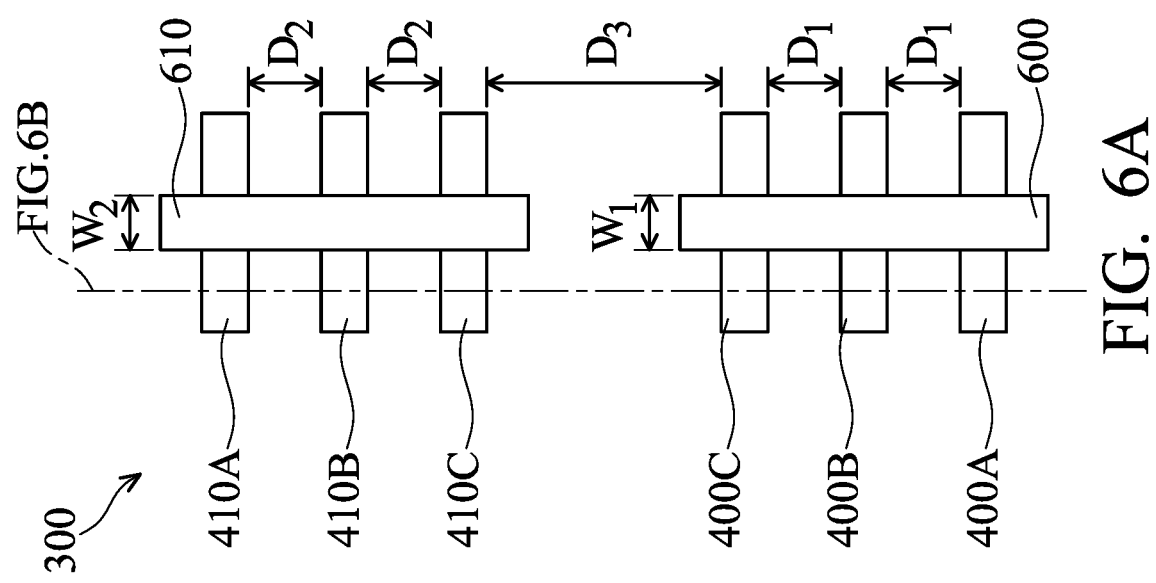

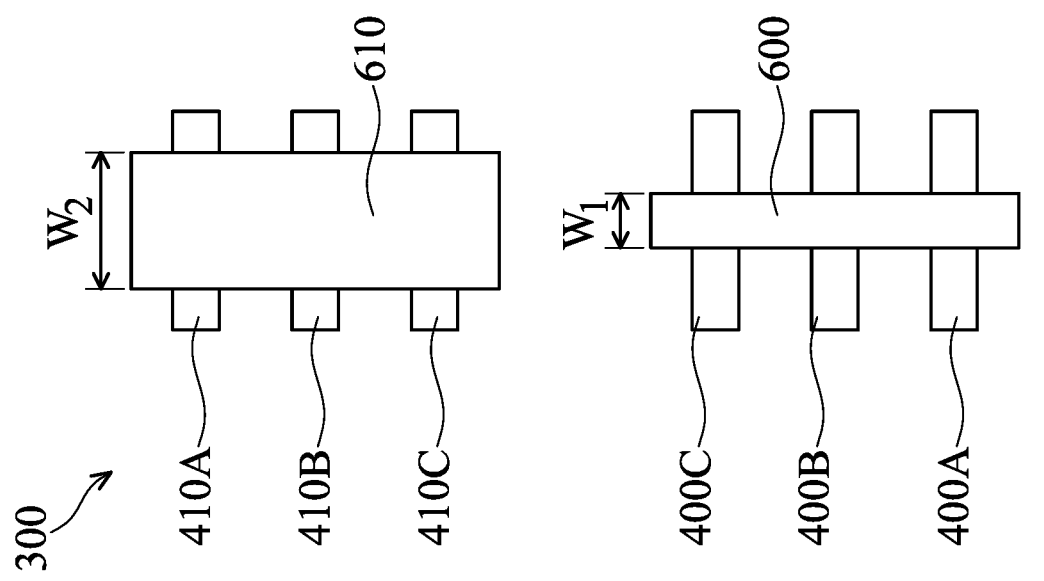

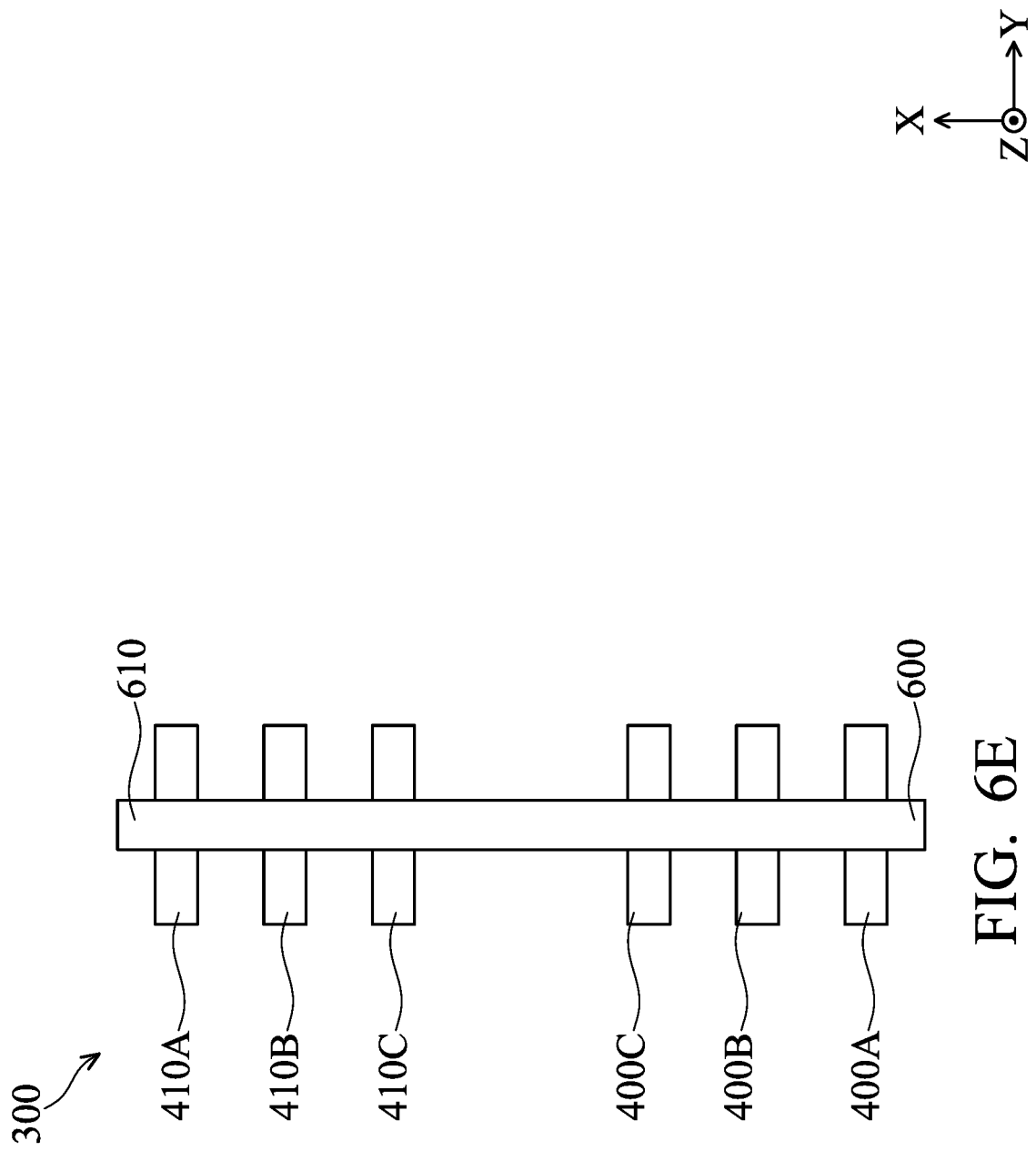

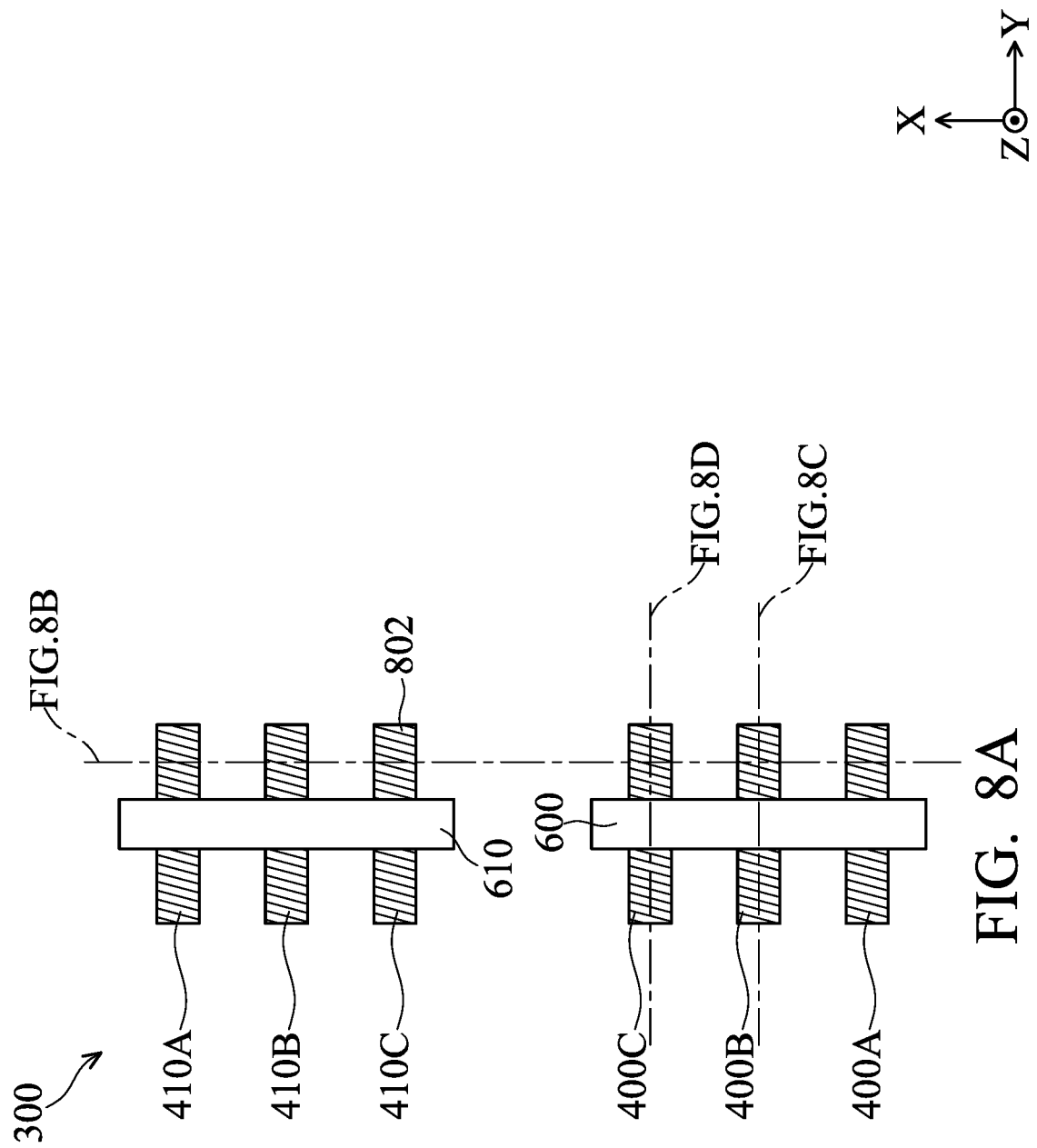

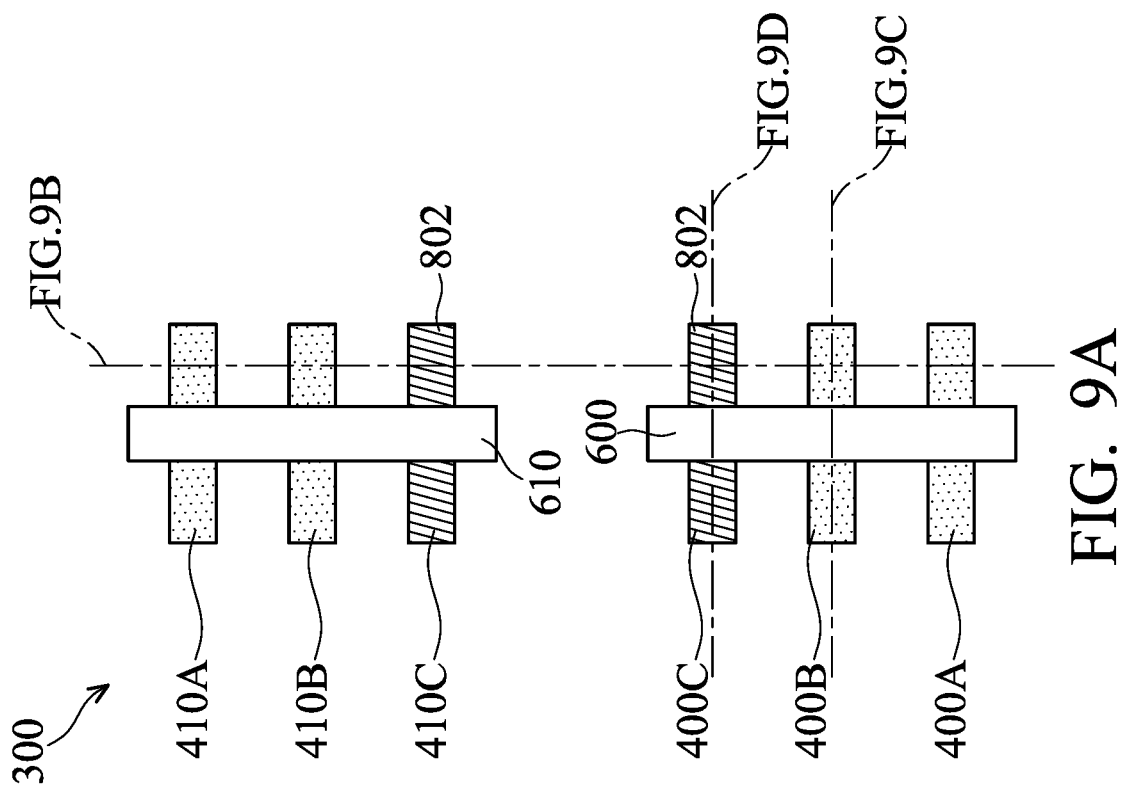

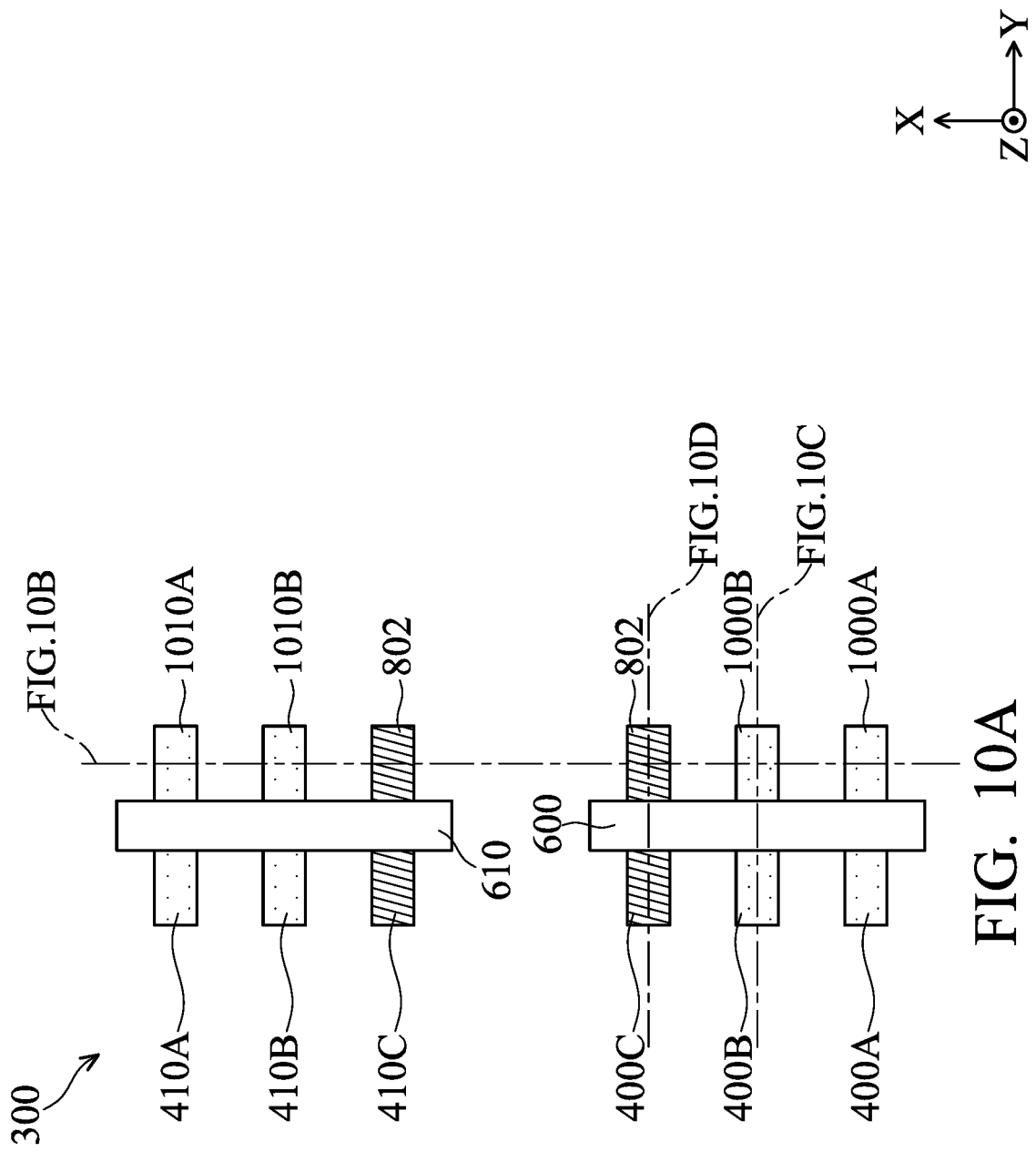

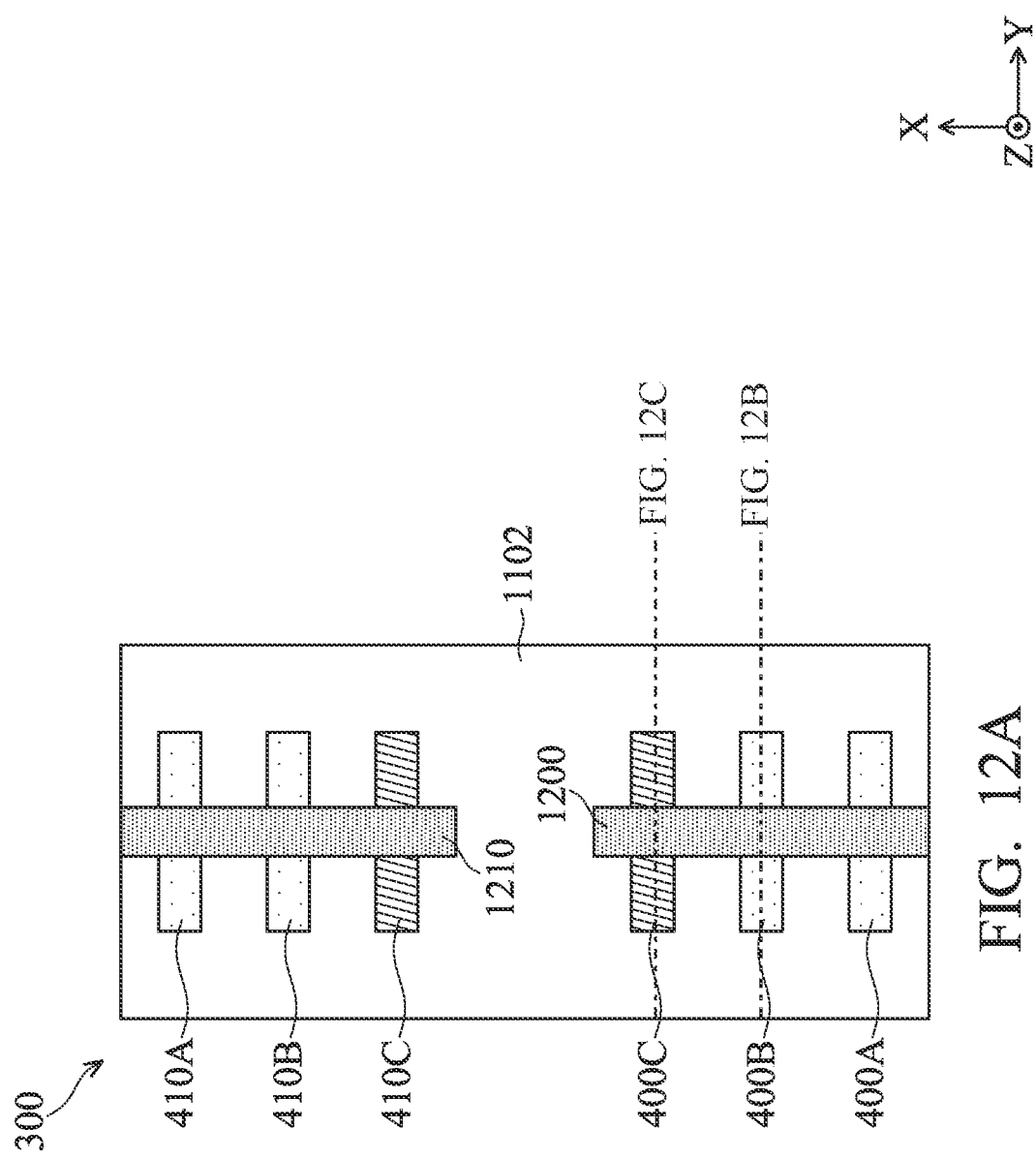

SEMICONDUCTOR DEVICES WITH DIELECTRIC PASSIVATION LAYER AND METHODS OF MANUFACTURING THEREOF

BACKGROUND

Embodiments of the present disclosure are discussed in the context of forming a gate-all-around (GAA) field-effect-transistor (FET) device, and in particular, in the context of forming a replacement gate of a GAA FET device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A, 6C, 6D, 6E, 6F, 6G, 7A, 8A, 9A, 10A, 11A, and 12A illustrate top views of an example GAA FET device (or a portion of the example GAA FET device) during various fabrication stages, made by the method of FIG. 2, in accordance with some embodiments.

DETAILED DESCRIPTION

Figure 1:
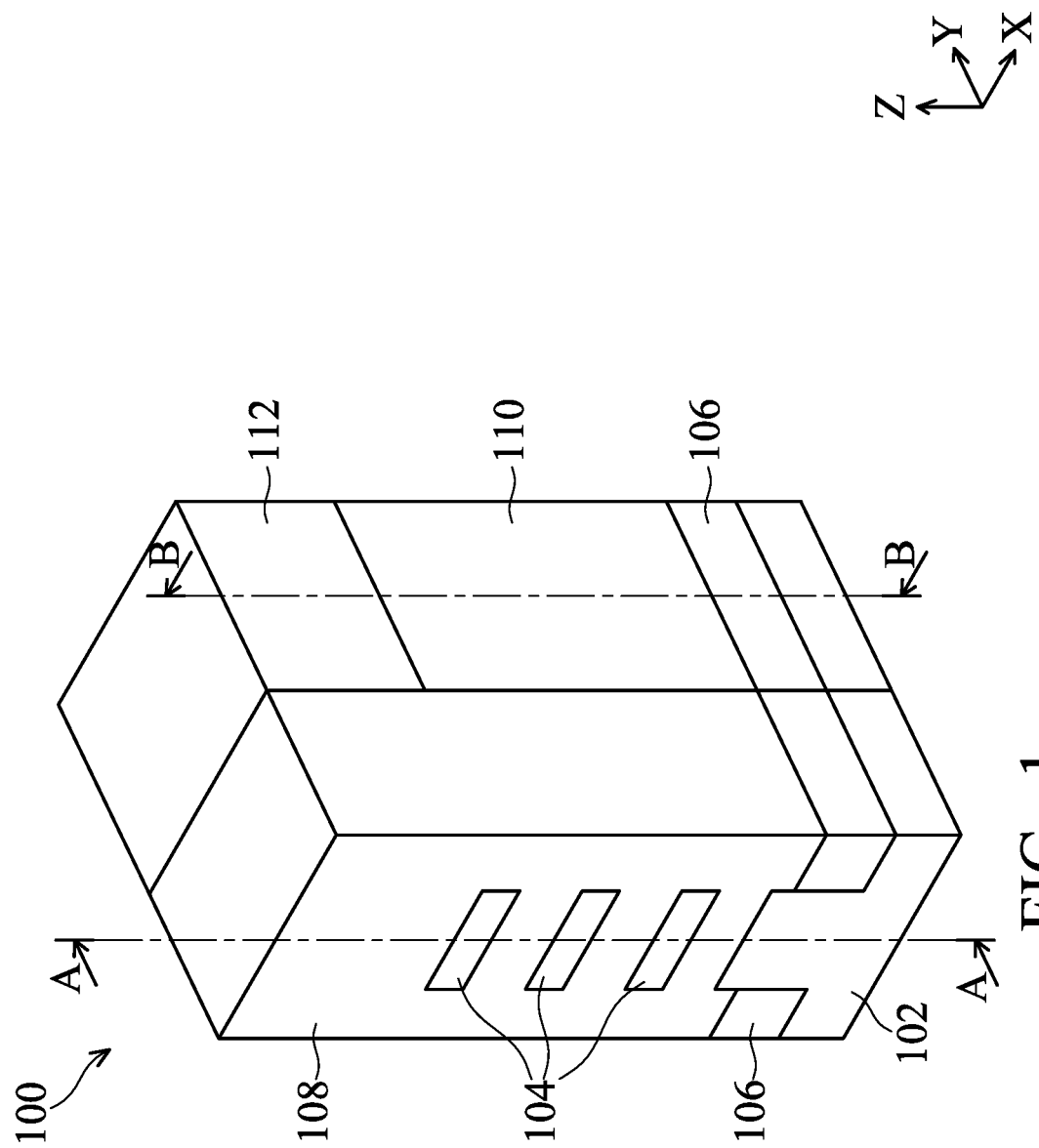
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, to make an integrated circuit on a substrate, a number of fins can be formed over the substrate. The fins may have multiple groups, each of which may provide a respective function in the integrated circuit. In certain cases, the fins in each group are spaced from each other with a first distance and two adjacent groups are spaced from each other with a second distance, wherein the second distance is greater than the first distance. As such, the fins (and corresponding device features) on respective edges of the adjacent groups may experience imbalanced processing conditions (e.g., different etching conditions when compared to the fins away from the edge), which is sometimes referred to as "iso-dense loading effect." This can cause various issues such as, for example, a poorly formed profile of the metal gate structure over the fins on the edges.

The present disclosure provides various embodiments of a semiconductor device and a method for forming the same, which can significantly limit the above-identified issues. For example, the semiconductor device, as disclosed herein, includes one or more inactive fins disposed on the edges of two adjacent fin groups, each of which includes a number of active fins. Such adjacent fin groups may be spaced apart with each other by a distance (hereinafter "inter-fin-group distance") greater than a distance separating the fins in each group (hereinafter "intra-fin-group distance"). In some embodiments, the active fin may be adopted as an active (e.g., electrically functional) fin or channel in a completed GAA FET device; and the inactive fin may not be adopted as an active (e.g., electrically functional) fin or channel in a completed GAA FET device. Further, in some embodiments, each of the fins (including the active and inactive fins) may include a number of semiconductor layers (e.g., nanosheets, nanowires, or otherwise nanostructures) vertically spaced apart from each other, in which each active fin is coupled with source/drain structures (e.g., epitaxially grown semiconductor structures) and each inactive fin is coupled with dielectric trenches.

By inserting the inactive fins on the edges of adjacent fin groups, the active fins in each of the fin groups can suffer significantly less iso-dense loading effect. This is because the inactive fins, which will not be functional, may protect the active fins from experiencing the effect. Further, by coupling the dielectric trench to "inactivate" the fins on the edges, various advantages can be provided especially in advanced processing nodes. For example, the dielectric trench may not be formed until a dummy gate structure, which will be replaced with a metal gate structure, is defined and formed. Even forming an inactive fin, the existing technologies typically forms such an inactive fin in a relatively early processing stage (e.g., prior to STI recessing, prior to forming a dummy gate structure). By "delaying" a timing to inactive the fins, a profile of the dummy gate structure, which is accordingly inherited by the metal gate structure, can be well defined and reserved. Thus, overall performance of the disclosed semiconductor device can be significantly enhanced.

FIG. 1 illustrates a perspective view of an example GAA FET device 100, in accordance with various embodiments.

The GAA FET device 100 includes a substrate 102 and a number of nanostructures (e.g., nanosheets, nanowires, etc.) 104 above the substrate 102. The nanostructures 104 are vertically separated from one another. Isolation regions 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source/drain structures are disposed on opposing sides of the gate structure 108, e.g., source/drain structure 110 shown in FIG. 1. An interlayer dielectric (ILD) 112 is disposed over the source/drain structure 110.

FIG. 1 depicts a simplified GAA FET device, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A extends along a longitudinal axis of the nanostructures 104 and in a direction of a current flow between the source/drain structures (e.g., in the Y direction). Cross-section B-B extends along an axis parallel with a longitudinal axis of the gate structure 108, which cut across the source/drain structure 110 (e.g., in the X direction). Subsequent figures refer to these reference cross-sections for clarity.

Figure 2:
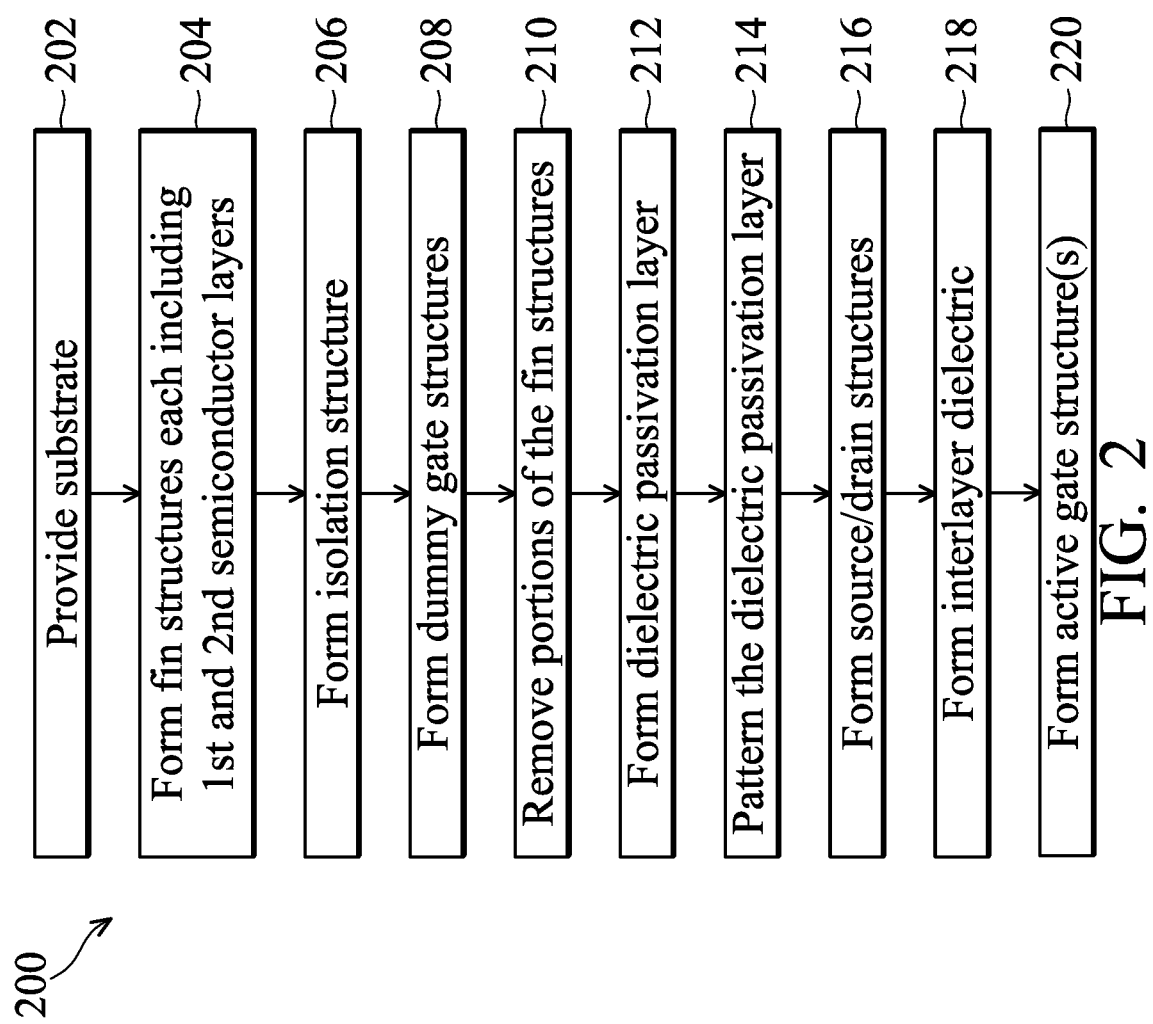
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional or top views of an example GAA FET device at various fabrication stages as shown in FIGS. 3, 4, 5, 6A, 6B, 6C, 6D, 6E, 6F, 6G, 7A, 7B, 7C, 7D, 8A, 8B, 8C, 8D, 9A, 9B, 9C, 9D, 10A, 10B, 10C, 10D, 11A, 11B, 11C, 11D, 12A, 12B, and 12C, respectively, which will be discussed in further detail below.

In brief overview, the method 200 starts with operation 202 of providing a substrate. The method 200 continues to operation 204 of forming a number of fin structures over the substrate. Each fin structure includes a number of first semiconductor layers and a number of second semiconductor layers. The method 200 continues to operation 206 of forming an isolation structure. The method 200 continues to operation 208 of forming one or more dummy gate structures. The method 200 continues to operation 210 of removing respective portions of the each of the fin structures. The method 200 continues to operation 212 of forming a dielectric passivation layer. The method 200 continues to operation 214 of patterning the dielectric passivation layer. The method 200 continues to operation 216 of forming source/drain structures. The method 200 continues to operation 218 of forming an interlayer dielectric. The method 200 continues to operation 220 of forming one or more active gate structures by removing the one or more dummy gate structures and the first semiconductor layers.

As mentioned above, FIGS. 3-12C each illustrate, in a cross-sectional or top view, a portion of a GAA FET device 300 at various fabrication stages of the method 200 of FIG. 2. The GAA FET device 300 is similar to the GAA FET device 100 shown in FIG. 1, but with multiple gate structures and multiple sets of nanostructures 104 (where each set is sometimes referred to as a fin structure in a completed GAA FET device). Although FIGS. 3-12C illustrate the GAA FET device 300, it is understood the GAA FET device 300 may include a number of other devices such as inductors, fuses, capacitors, coils, etc., which are not shown in FIGS. 3-12C, for purposes of clarity of illustration.

Figure 3:
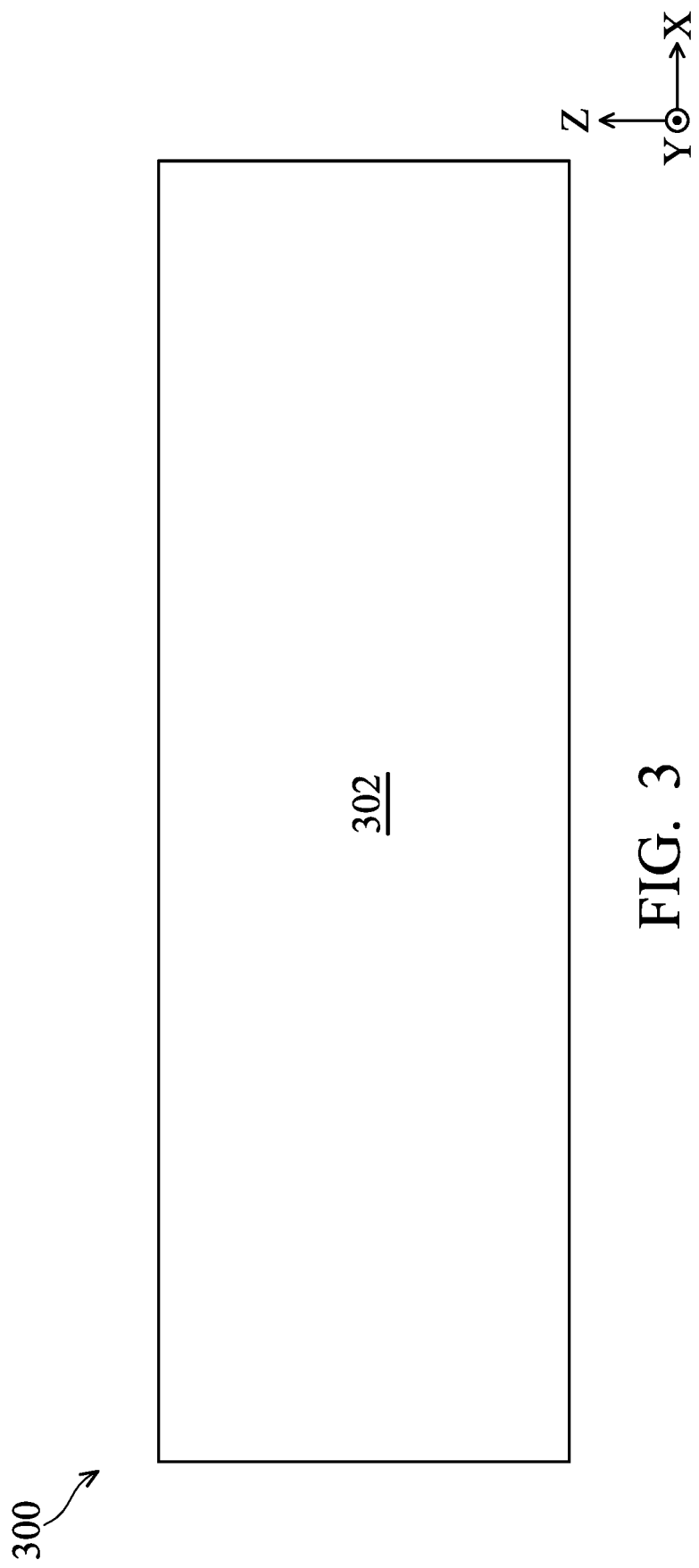
FIGS. 3, 4, 5, 6B, 7B, 7C, 7D, 8B, 8C, 8D, 9B, 9C, 9D, 10B, 10C, 10D, 11B, 11C, 11D, 12B, and 12C illustrate cross-sectional views of an example GAA FET device (or a portion of the example GAA FET device) during various fabrication stages, made by the method of FIG. 2, in accordance with some embodiments.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction parallel to the lengthwise direction of an active/dummy gate structure of the GAA FET device 300 (e.g., cross-section B-B indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
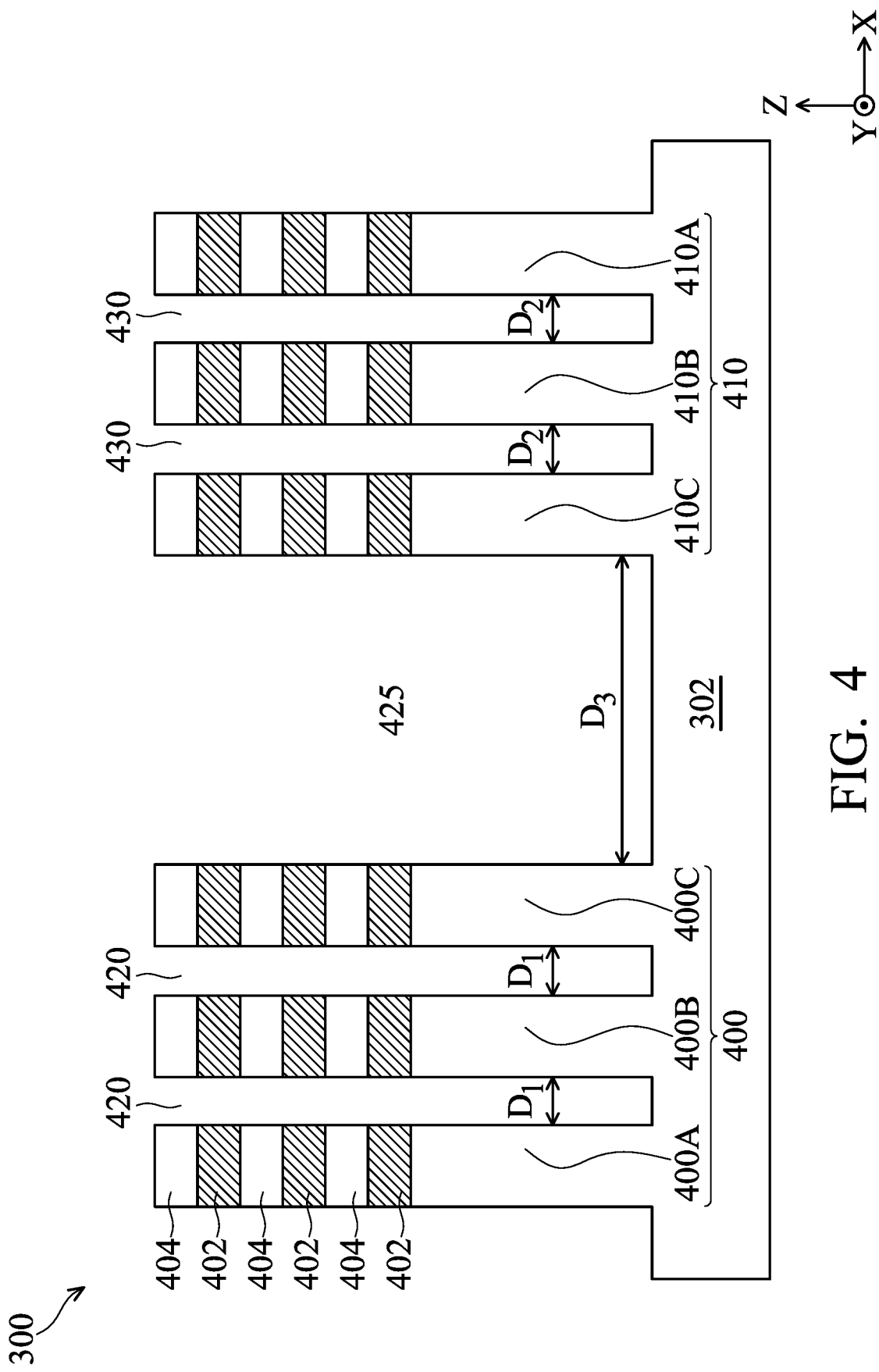

Corresponding to operation 204 of FIG. 2, FIG. 4 is a cross-sectional view of the GAA FET device 300 including a number of fin structures 400A, 400B, 400C, 410A, 410B, and 410C, at one of the various stages of fabrication. The cross-sectional views of FIG. 4 is cut in a direction parallel to the lengthwise direction of an active/dummy gate structure of the GAA FET device 300 (e.g., cross-section B-B indicated in FIG. 1).

As shown, the fin structures 400A-C may be formed as a first fin group 400 in a first area of the substrate 302; and the fin structures 410A-C may be formed as a second fin group 410 in a second area of the substrate 302. Although three fin structures are included in each fin group, it should be understood that each fin group can include any number of fin structures, while remaining within the scope of the present disclosure. Each of the fin structures 400A-C (in the first fin group 400) may be laterally spaced from one another (e.g., in the X direction) by a first (intra-fin-group) distance, $D_1$; and each of the fin structures 410A-C (in the second fin group 410) may be laterally spaced from one another (e.g., in the X direction) by a second (intra-fin-group) distance, $D_2$. Further, the first and second fin groups 400 and 410 are laterally spaced by a third (inter-fin-group) distance, $D_3$, different from $D_1$ and $D_2$.

For example, the fin structures 400B and 400C in the same first fin group 400 are spaced from each other by $D_1$ (similarly, the fin structures 410B and 410C in the same second fin group 410 are spaced from each other by $D_2$), and the fin structure 400C on an "edge" of the first fin group and the fin structure 410C on an "edge" of the second fin group are spaced from each other by $D_3$. In some embodiments, the fin structures 400C and 410C may sometimes be referred to as edge fin structures. The term "edge fin structure," as used herein, may refer to a fin structure that is disposed as a last one in a first fin group, and next to a second fin group. Accordingly, a fin structure that is not disposed on the edge of a fin group (e.g., with one or more edge fin structures disposed next to it) may sometimes be referred to as a "non-edge fin structure." In various embodiments, $D_3$ is greater than any of $D_1$ or $D_2$. As a non-limiting example, $D_3$ can range from about 10 nanometers (nm) to about 3000 nm, and $D_1$ and $D_2$ can each range from about 5 nm to about 300 nm.

Each of the fin structures 400A-C and 410A-C includes a number of first semiconductor layers and a number of second semiconductor layers alternately disposed on top of one another. Using the fin structure 400A (shown in FIG. 4) as a representative example, the fin structure 400A includes first semiconductor layers 402 and second semiconductor layers 404. The first semiconductor layers 402 and the second semiconductor layers 404 are alternatingly disposed on top of one another (e.g., along the Z direction). For example, one of the second semiconductor layers 404 is disposed over one of the first semiconductor layers 402 then another one of the first semiconductor layers 402 is disposed over the second semiconductor layer 404, so on and so forth.

Each of the fin structures 400A-C and 410A-C may include any number of alternately disposed first and second semiconductor layers 402 and 404. For example in FIG. 4, the fin structure 400A includes 3 first semiconductor layers 402, with 3 second semiconductor layers 404 alternatingly disposed therebetween and with one of the second semiconductor layers 404 being the topmost semiconductor layer. It should be understood that the fin structure of the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 402 and 404 may have respective different thicknesses. Further, the first semiconductor layers 402 may have different thicknesses from one layer to another layer. The second semiconductor layers 404 may have different thicknesses from one layer to another layer. The thickness of each of the semiconductor layers 402 and 404 may range from few nanometers to few tens of nanometers. The bottommost layer of the fin structure may be thicker than other semiconductor layers 402 and 404. In an embodiment, each of the first semiconductor layers 410 has a thickness ranging from about 5 nanometers (nm) to about 20 nm.

The two semiconductor layers 402 and 404 have different compositions. In various embodiments, the two semiconductor layers 402 and 404 have compositions that provide for different oxidation rates and/or different etch selectivity between the layers. In an embodiment, the first semiconductor layers 402 include silicon germanium ($Si_{1-x}Ge_x$), and the second semiconductor layers 404 include silicon (Si). In an embodiment, each of the second semiconductor layers 404 is silicon that may be undoped or substantially dopant-free (i.e., having an extrinsic dopant concentration from about 0 $cm^{-3}$ to about $1\times10^{17}$ $cm^{-3}$), where for example, no intentional doping is performed when forming the layers 404 (e.g., of silicon).

In various embodiments, the semiconductor layers 404 may be intentionally doped. For example, when the GAA FET device 300 is configured in n-type (and operates in an enhancement mode), each of the semiconductor layers 404 may be silicon that is doped with a p-type dopant such as boron (B), aluminum (Al), indium (In), and gallium (Ga); and when the GAA FET device 300 is configured in p-type (and operates in an enhancement mode), each of the semiconductor layers 404 may be silicon that is doped with an n-type dopant such as phosphorus (P), arsenic (As), antimony (Sb). In another example, when the GAA FET device 300 is configured in n-type (and operates in a depletion mode), each of the semiconductor layers 404 may be silicon that is doped with an n-type dopant instead; and when the GAA FET device 300 is configured in p-type (and operates in a depletion mode), each of the semiconductor layers 404 may be silicon that is doped with a p-type dopant instead. In some embodiments, each of the semiconductor layers 402 is $Si_{1-x}Ge_x$ that includes less than 50% (x<0.5) Ge in molar ratio. For example, Ge may comprise about 15% to 35% of the semiconductor layers 402 of $Si_{1-x}Ge_x$ in molar ratio. Furthermore, the first semiconductor layers 402 may include different compositions among them, and the second semiconductor layers 404 may include different compositions among them.

Either of the semiconductor layers 402 and 404 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, GaInAs, GaInP, and/or GaInAsP, or combinations thereof. The materials of the semiconductor layers 402 and 404 may be chosen based on providing differing oxidation rates and/or etch selectivity.

The semiconductor layers 402 and 404 can be epitaxially grown from the semiconductor substrate 302 as blanket layers, respectively. For example, a number of blanket semiconductor layers 402 and a number of blanket semiconductor layers 404 may be grown on the substrate 302 by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the blanket semiconductor layers 402 and 404 having the same crystal orientation with the semiconductor substrate 302. Upon growing the blanket semiconductor layers 402 and 404 on the semiconductor substrate 302 (as a stack), the stack may be patterned to form the fin structures (e.g., 400A-C, 410A-C).

The fin structures are formed by patterning the blanket semiconductor layers 402-404 and the semiconductor substrate 302 using, for example, photolithography and etching techniques. For example, a mask layer (which can include multiple layers such as, for example, a pad oxide layer and an overlying pad nitride layer) is formed over the topmost semiconductor layer. The pad oxide layer may be a thin film comprising silicon oxide formed, for example, using a thermal oxidation process. The pad oxide layer may act as an adhesion layer between the topmost semiconductor layer and the overlying pad nitride layer. In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the blanket semiconductor layers 402-404 and the substrate 302 to form trenches (or openings) 420, 425, and 430, thereby defining the fin structures 400A-C and 410A-C between adjacent trenches. For example, the trench 420 may be formed to define adjacent fin structures 400A and 400B, and/or 400B and 400C; the trench 425 may be formed to define adjacent fin structures 400C and 410C; and the trench 430 may be formed to define adjacent fin structures 410A and 410B, and/or 410B and 410C. Accordingly, respective widths (along the X direction) of the trenches 420, 425, and 430 can be characterized with the distances, $D_1$, $D_3$, and $D_2$, respectively, Each of the fin structures 400A-C and 410A-C can have a width extending along the X direction that is of about 3 nm to about 100 nm. In some embodiments, the fin structures 400A-C and 410A-C are formed by etching the blanket semiconductor layers 402-404 and substrate 302 using, for example, reactive ion etch (RIE), neutral beam etch (NBE), the like, or combinations thereof. The etch may be anisotropic. In some embodiments, the trenches 420-430 may be strips (when viewed from the top) parallel to each other, and closely spaced with respect to each other. In some embodiments, the trenches 420-430 may be continuous and surround corresponding fin structure(s).

Figure 5:
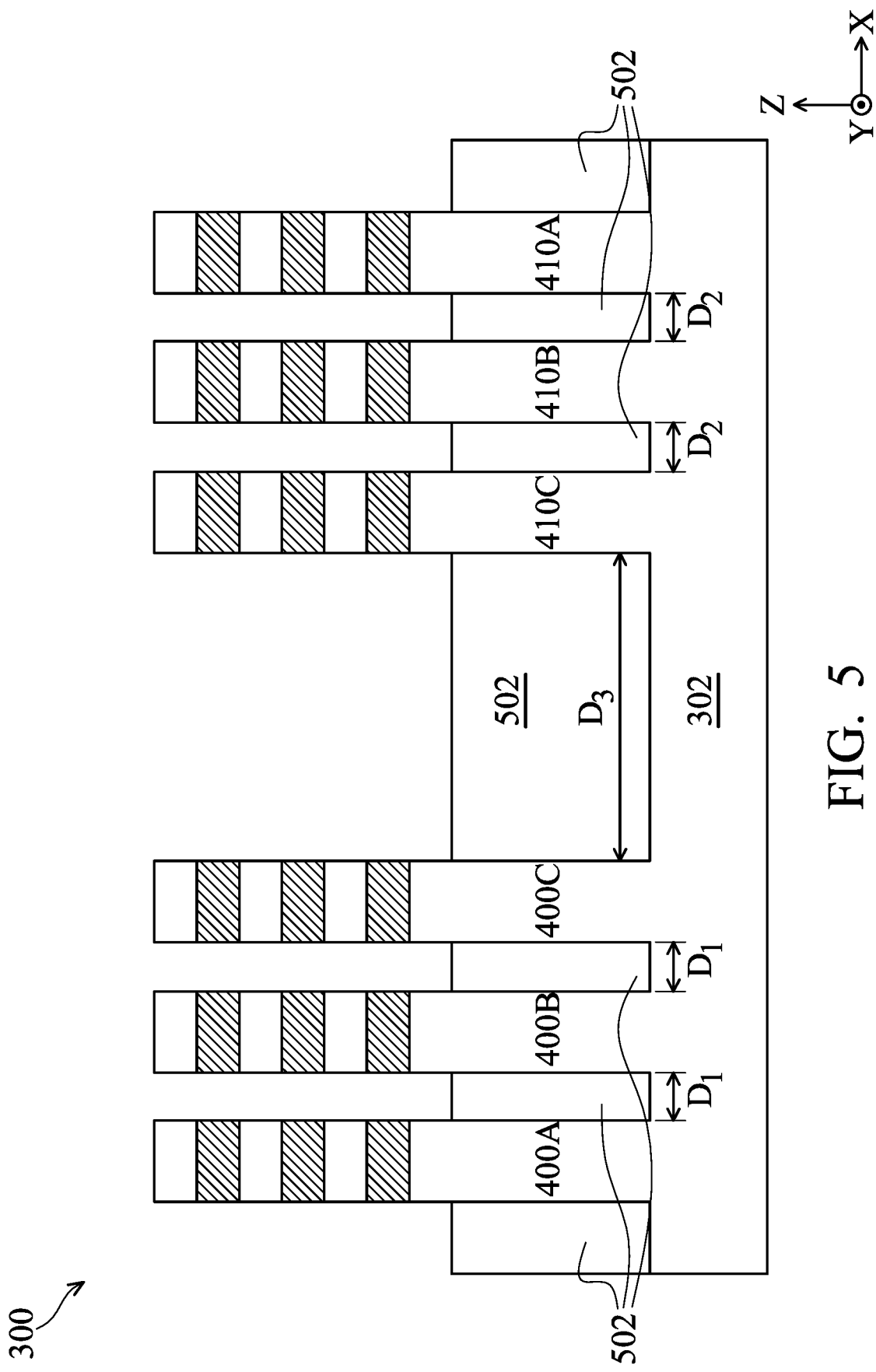

Corresponding to operation 206 of FIG. 2, FIG. 5 is a cross-sectional view of the GAA FET device 300 including an isolation structure 502, at one of the various stages of fabrication. The cross-sectional views of FIG. 5 is cut in a direction parallel to the lengthwise direction of an active/dummy gate structure of the GAA FET device 300 (e.g., cross-section B-B indicated in FIG. 1).

The isolation structure 502, which is formed of an insulation material, includes one or more portions to electrically isolate neighboring fin structures from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP), may remove any excess insulation material and form a top surface of the isolation structure 502 and a top surface of the fin structures 400A-C and 410A-C that are coplanar (not shown). The patterned mask used to define the fin structures 400A-C and 410A-C may also be removed by the planarization process.

In some embodiments, the isolation structure 502 includes a liner, e.g., a liner oxide (not shown), at the interface between each portion of the isolation structure 502 and the substrate 302. In some embodiments, the liner oxide is formed to reduce crystalline defects at the interface between the substrate 302 and the isolation structure 502. Similarly, the liner oxide may also be used to reduce crystalline defects at the interface between the fin structures 400A-C and 410A-C and the isolation structure 502. The liner oxide (e.g., silicon oxide) may be a thermal oxide formed through a thermal oxidation of a surface layer of the substrate 302, although other suitable method may also be used to form the liner oxide.

Next, the isolation structure 502 is recessed to form a shallow trench isolation (STI) structure 502, as shown in FIG. 5. The isolation structure 502 is recessed such that respective upper portions of the fin structures 400A-C an 410A-C protrude from between neighboring portions of the STI structure 502. A top surface of the STI structure 502 may have a flat surface (as illustrated), a convex surface, a concave surface (such as dishing), or combinations thereof. The top surface of the STI structure 502 may be formed flat, convex, and/or concave by an appropriate etch. The isolation structure 502 may be recessed using an acceptable etching process, such as one that is selective to the material of the isolation structure 502. For example, a dry etch or a wet etch using dilute hydrofluoric (DHF) acid may be performed to recess the isolation structure 502.

Figure 6B:
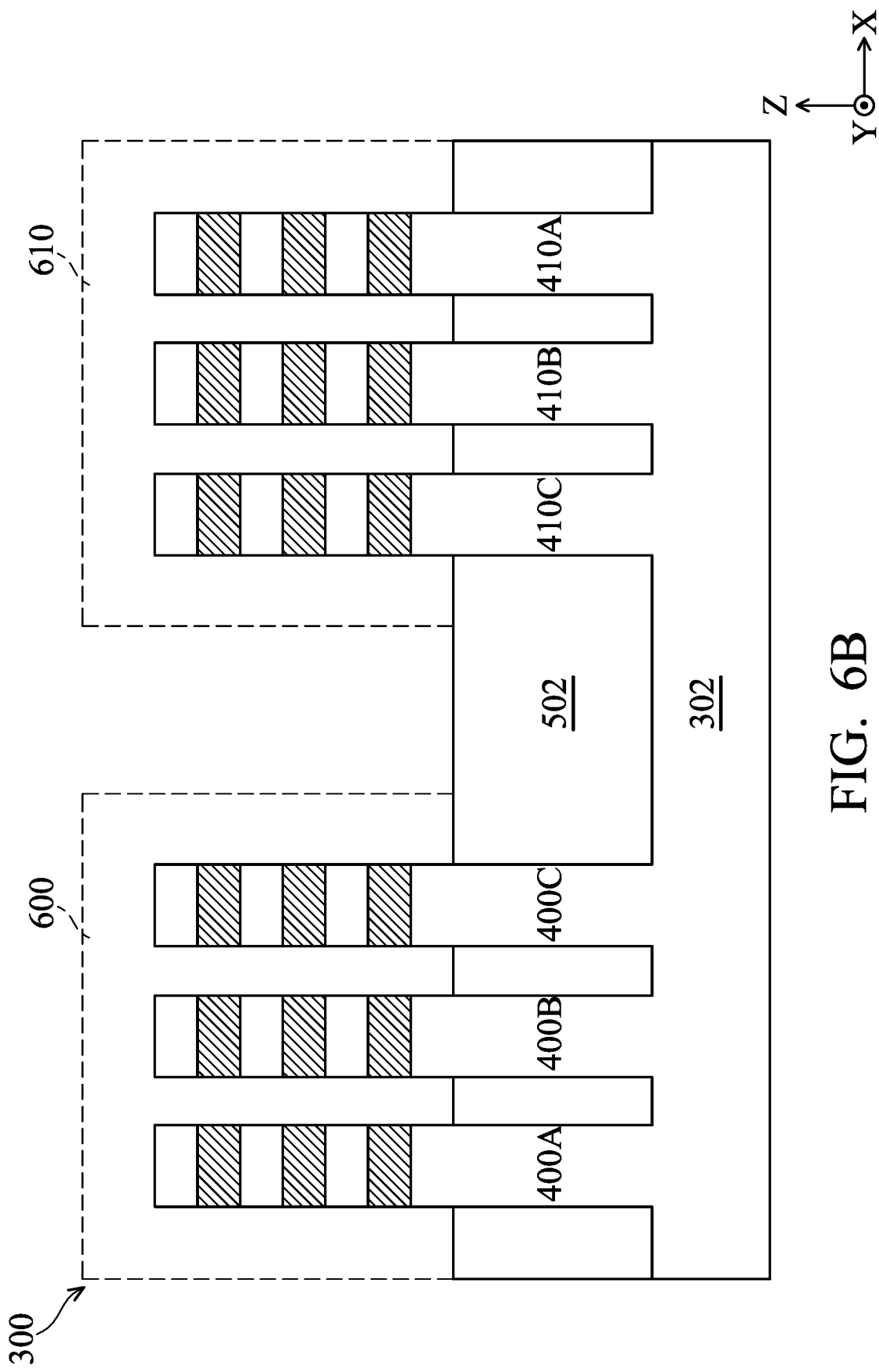

Corresponding to operation 208 of FIG. 2, FIG. 6A is a top view of the GAA FET device 300 including one or more dummy gate structures 600 and 610, at one of the various stages of fabrication; and FIG. 6B is a corresponding cross-sectional view of the GAA FET device 300. The cross-sectional view of FIG. 6B is cut in a direction parallel to the lengthwise direction of an active/dummy gate structure of the GAA FET device 300 (e.g., cross-section B-B indicated in FIG. 1).

As shown in FIG. 6A, the dummy gate structures 600 and 610 are formed over the fin structures 400A-C and 410A-C, respectively, where the fin structures 400A-C are separated from each other by $D_1$, the fin structures 410A-C are separated from each other by $D_2$, and the fin groups 400A-C and 410A-C (the edge fin structures 400C and 410C) are separated from each other by $D_3$. The dummy gate structures 600 and 610 can each extend along a lateral direction (e.g., the X direction) perpendicular to the lateral direction along which the fin structures extend. The dummy gate structures 600 and 610 may be placed where respective active (e.g., metal) gate structures are later formed, in various embodiments. For example in FIG. 6A, the dummy gate structure 600 is placed over a respective portion of each of the fin structures 400A-C; and the dummy gate structure 610 is placed over a respective portion of each of the fin structures 410A-C. Such an overlaid portion of the fin structure is later formed as a conduction channel, which includes portions of the second semiconductor layers 404, and the dummy gate structures 600-610 are each replaced with an active gate structure to warp around each of the portions of the second semiconductor layers 404.

The dummy gate structures 600-610 each include a dummy gate dielectric and a dummy gate, in some embodiments. For purposes of clarity of illustration, the dummy gate dielectric and dummy gate are shown as a single piece in the figures of the present disclosure. To form the dummy gate structures 600-610, a dielectric layer is formed on the fin structures 400A-C and 410A-C. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown. A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like. After the layers (e.g., the dielectric layer, the gate layer, and the mask layer) are formed, the mask layer may be patterned using suitable lithography and etching techniques to form a mask. The pattern of the mask then may be transferred to the gate layer and the dielectric layer by a suitable etching technique to form the dummy gate structures 600-610.

Referring to FIG. 6B, the dummy gate structures 600-610 (which are shown in dotted lines) are formed over the fin structures 400A-C and 410A-C, respectively, and in direct contact with the STI structure 502. It should be appreciated that the GAA FET device 300 can include the dummy gate structures formed in other configurations, while remaining within the scope of the present disclosure. For example, between the adjacent fin structures (along the X direction), a cladding layer (similar as the first semiconductor layer 402) and a dummy fin structure (overlaid or protected by a high-k dielectric layer) can be formed to produce a substantially planar top surface shared by the fin structures, the cladding layer, and the dummy fin structure. As used herein, the term "substantially planar" refers to a structure when the deviation of the structure from a plane is within the statistical atomic level variations inherent within semiconductor processing methods known in the art. In such embodiments, the dummy gate structures 600-610 may be formed over such a substantially planar top surface, with an etch stop layer disposed therebetween. The etch stop layer may include silicon oxide. The etch stop layer may be formed by a deposition process, such as chemical vapor deposition (CVD) (e.g., plasma enhanced chemical vapor deposition (PECVD), high aspect ratio process (HARP), or combinations thereof) process, atomic layer deposition (ALD) process, another applicable process, or combinations thereof.

Figure 6D:
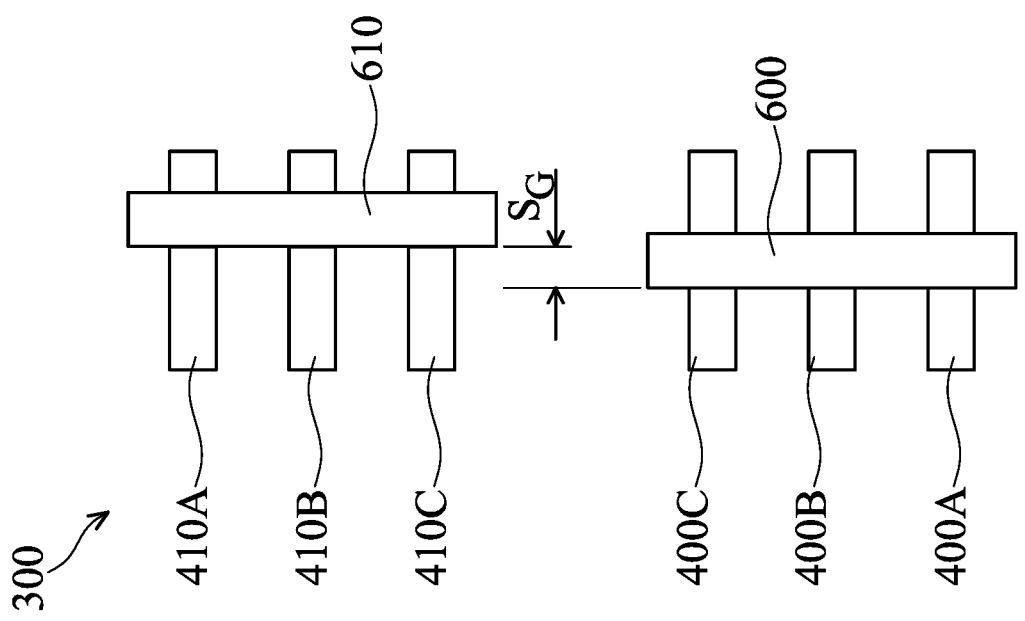
Figure 6D:
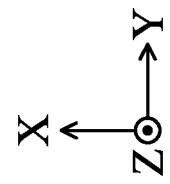
Figure 6F:
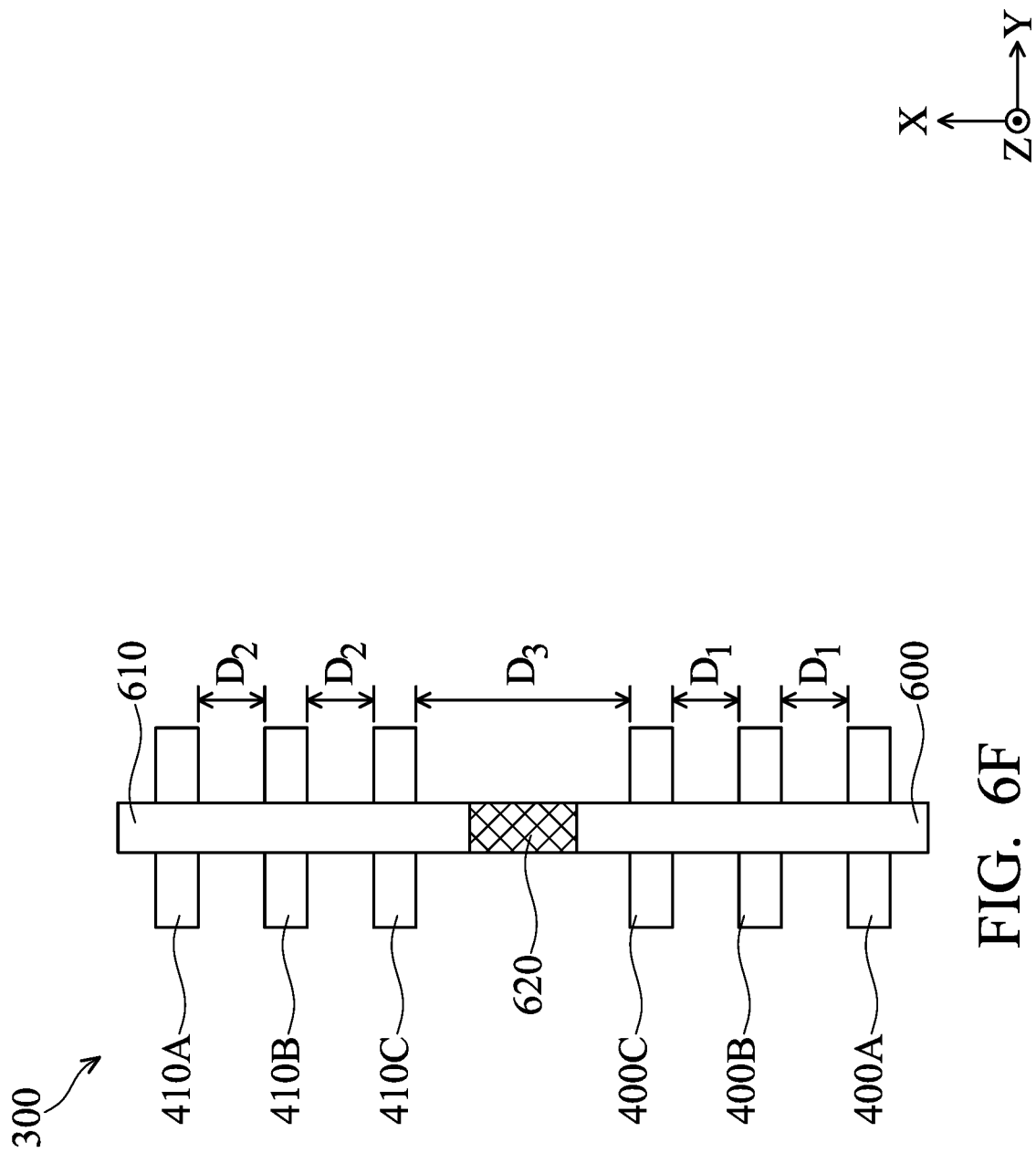
Figure 6G:
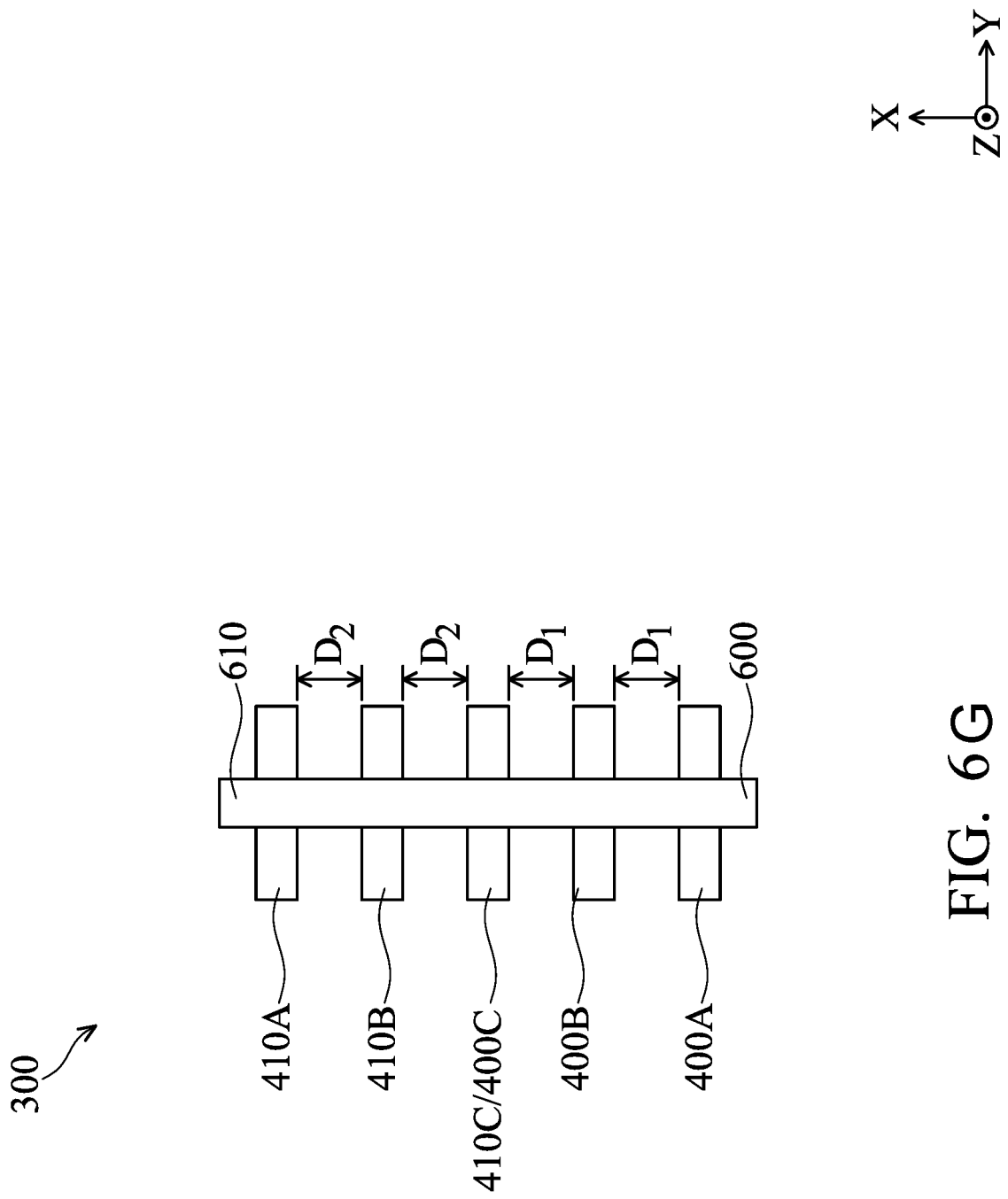

The dummy gate structures 600 and 610 can be formed in various configurations, which will be discussed below with respect to FIGS. 6A, and 6B-6G. Referring again to FIG. 6A, the dummy gate structures 600 and 610 are aligned along the X direction, and have respective widths along the Y direction. For example, the dummy gate structure 600 has a width, $W_1$, and the dummy gate structure 610 has a width, $W_2$. $W_1$ and $W_2$ can each range from about 1 nm to about 500 nm. In the illustrated example of FIG. 6A, $W_1$ is about equal to $W_2$. The aligned dummy gate structures 600 and 610 can have different widths. For example, $W_1$ can be different from $W_2$, as illustrated in FIG. 6C. The dummy gate structures 600 and 610 can be offset from each other along the Y direction with a distance $S_G$, as illustrated in FIG. 6D. The distance may range from about 1 nm to about 500 nm. In some embodiments, the dummy gate structures 600 and 610 may be integrally formed as a single piece, as illustrated in FIG. 6E. In some embodiments, the dummy gate structures 600 and 610 may be first integrally formed as a single piece, and then be disconnected or cut separately with a gate isolation structure 620, as illustrated in FIG. 6F. The gate isolation structure 620 may be formed of a dielectric material, thereby causing the dummy gate structures 600 and 610 to be electrically isolated from each other. The gate isolation structure 620 may extend along the X direction with a distance less than or equal to $D_3$. Such gate isolation structure 620 can be formed over an STI (e.g., 502) or a dielectric dummy fin structure (not shown) disposed between the edge fin structures 400C and 410C. In some embodiments, the edge fin structures 400C and 410C may be formed as a single edge fin structure between two fin groups, as illustrated in FIG. 6G. As such, $D_3$ may not be present.

Figure 7A:
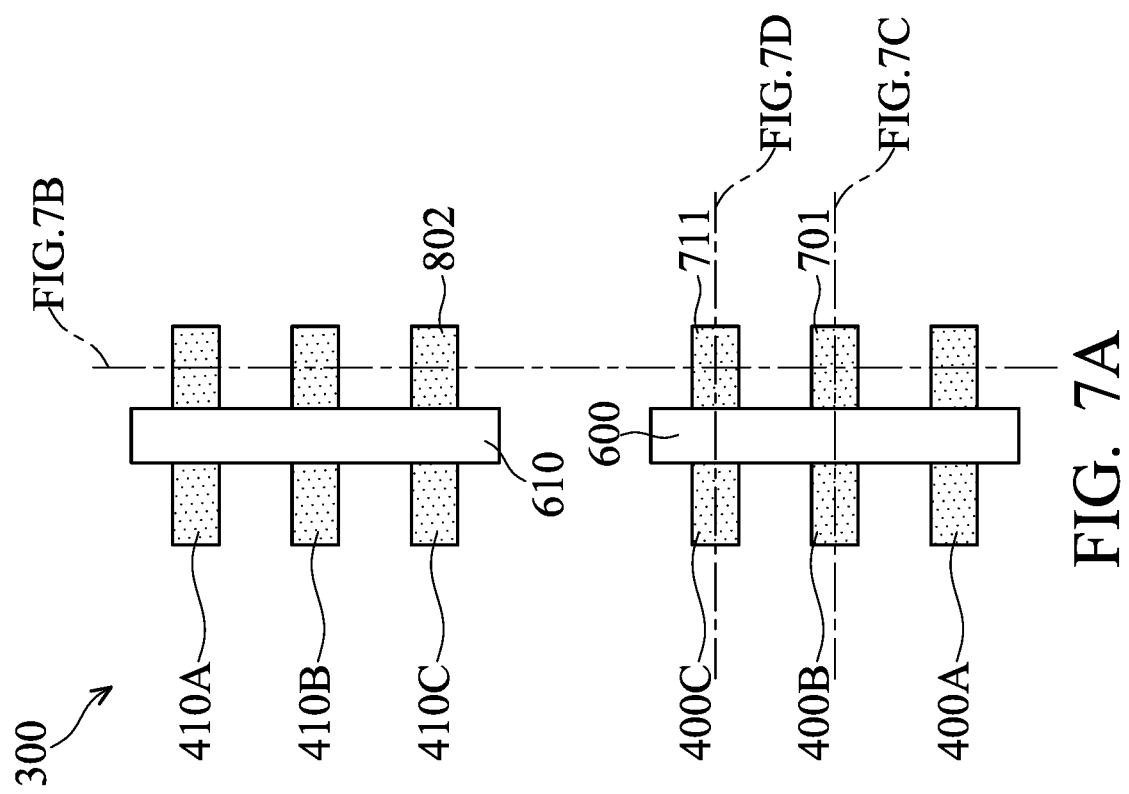
Figure 7B:
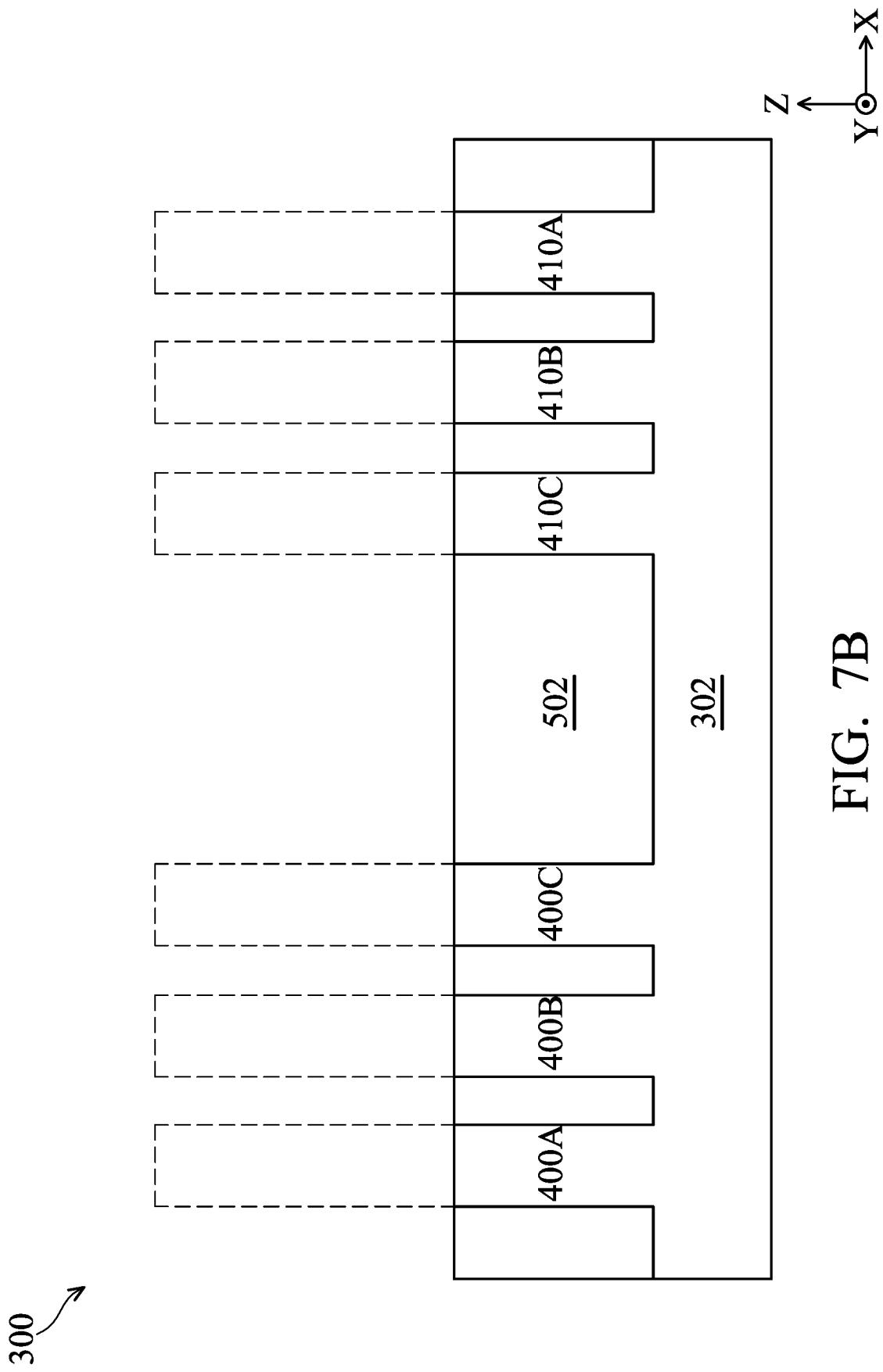
Figure 7C:
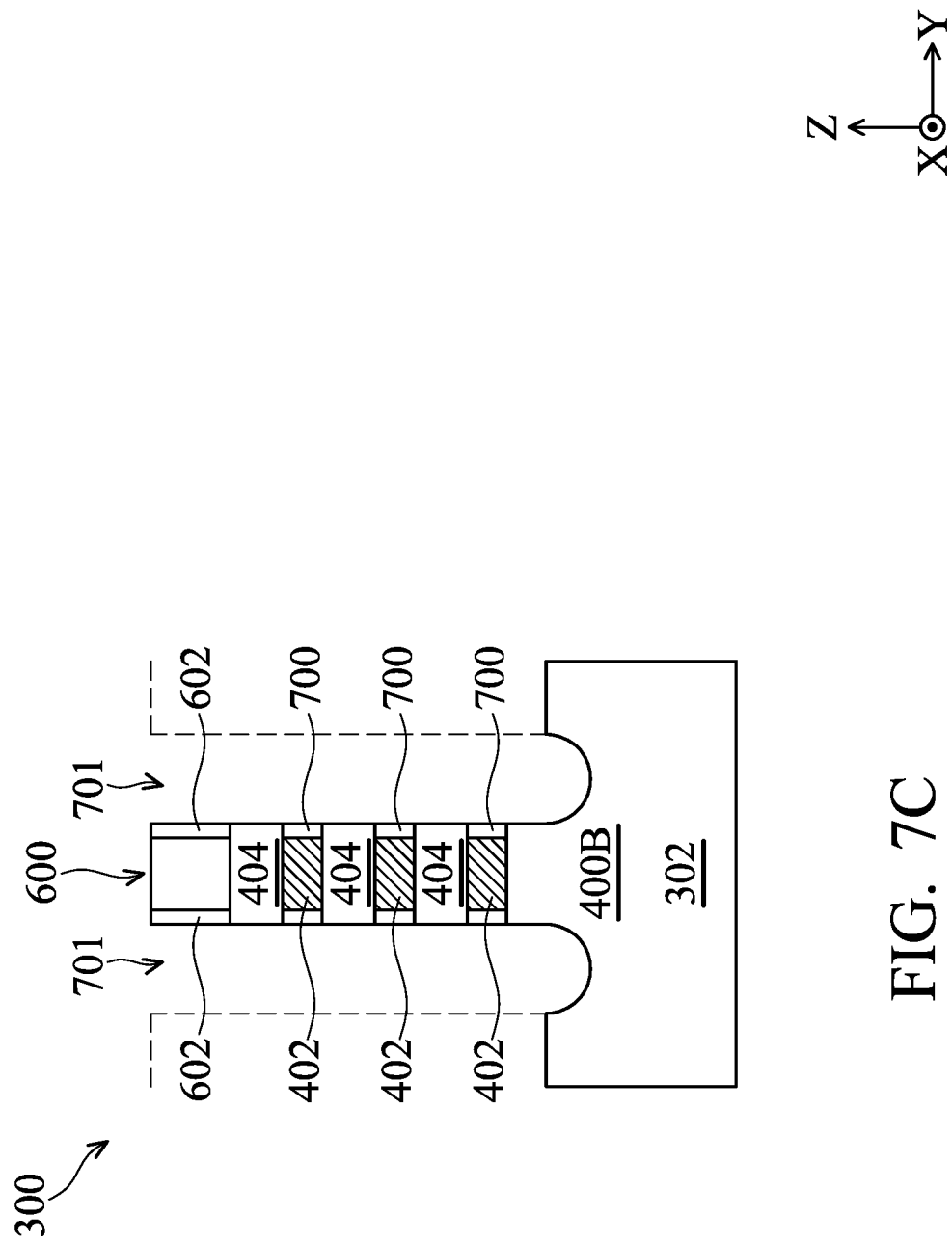
Figure 7D:
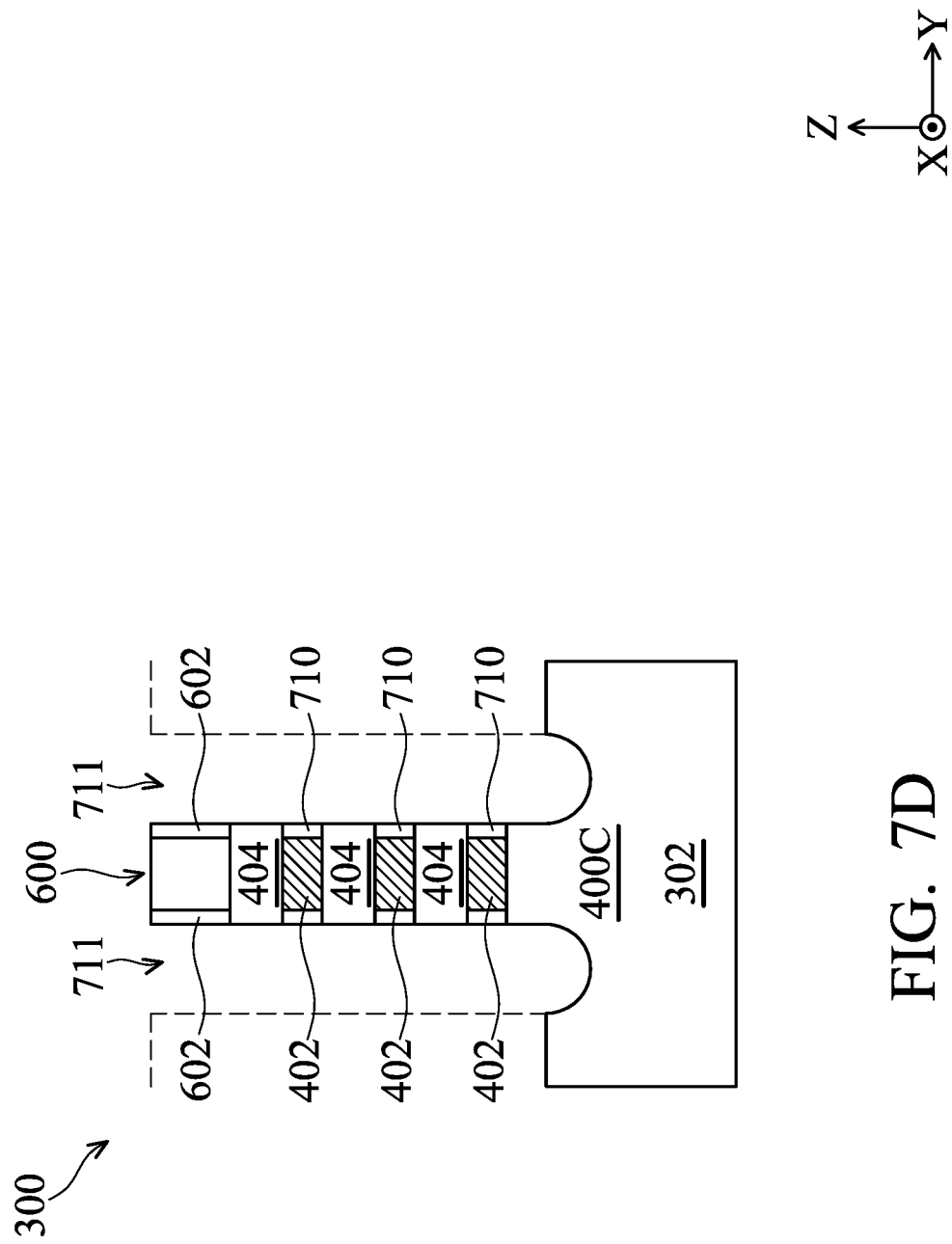

Corresponding to operation 210 of FIG. 2, FIG. 7A is a top view of the GAA FET device 300 in which respective portions of each of the fin structures 400A-C and 410A-C that are not overlaid by the dummy gate structure 600 or 610 are removed, at one of the various stages of fabrication. FIGS. 7B, 7C, and 7D are corresponding cross-sectional view of the GAA FET device 300. The cross-sectional view of FIG. 7B is cut in a direction parallel to the lengthwise direction of an active/dummy gate structure of the GAA FET device 300 (e.g., cross-section B-B indicated in FIG. 1); the cross-sectional view of FIG. 7C is cut in a direction along the lengthwise direction of a non-edge fin structure of the GAA FET device 300 (e.g., cross-section B-B indicated in FIG. 1); and the cross-sectional view of FIG. 7D is cut in a direction along the lengthwise direction of an edge fin structure of the GAA FET device 300 (e.g., cross-section B-B indicated in FIG. 1). As representative examples, FIG. 7C is cut along a lengthwise direction of the fin structure 400B; and FIG. 7D is cut along a lengthwise direction of the fin structure 400C.

The dummy gate structures 600-610 can serve as a mask to etch the non-overlaid portions of the fin structures 400A-C and 410A-C, which results in the fin structures 400A-C and 410A-C each including remaining portions of the semiconductor layers 402 and 404 alternatingly stacked on top of one another. The etched (removed) portions of the fin structures 400A-C and 410A-C are shown in dotted lines in FIG. 7B. Such an etching step may be stopped when an intermediate surface of the fin structures 400A-C and 410A-C is about leveled with the top surface of the isolation structure 502. In the illustrated example of FIG. 7B, the etched intermediate surface of the fin structures and the top surface of the isolation structure 502 share a flat surface. It should be understood that the etched intermediate surface of each of the fin structures may be recessed with respect the top surface of the isolation structure 502 (e.g., curve inwardly toward the substrate 302), in some embodiments. In some other embodiments, while removing the non-overlaid portions of the edge fin structures 400C and 410C, the non-overlaid portions of the non-edge fin structures 400A-B and 410A-B may remain through the step of growing the respective source/drain structures. For example, the source/drain structures, which will be discussed in further detail below, can wrap around such "protruding" portions of the (e.g., Si) semiconductor layers 404 in the non-edge fin structures 400A-B and 410A-B.

FIGS. 7C and 7D illustrate the cross-sectional view of the GAA FET device 300 cut across the fin structures 400B and 400C, respectively. Along the Z direction, the fin structures 400B may have newly formed sidewalls that are aligned with sidewalls of the dummy gate structure 600, which can further include gate spacers 602 disposed on its both sides; and the fin structures 400C may have newly formed sidewalls that are also aligned with the sidewalls of the dummy gate structure 600. Although not shown in the top view of FIG. 7A, it should be understood that one or more dummy gate structures (in parallel with the dummy gate structures 600/610) can be formed to overlay the fin structures 400A-C and/or 410A-C. For example, each of the fin structures can be overlaid by multiple dummy gate structures that are in parallel with one another. Each of the dummy gate structures can serve as a mask to etch non-overlaid portions of the fin structures. As such, trenches, which are sandwiched between respective different remaining portions of each of the fin structures, can be formed.

For example in FIG. 7C, trenches 701 are formed on the sides of the dummy gate structure 600 (and on the sides of the remaining portion of the fin structure 400B that is overlaid by the dummy gate structure 600). Each of the trenches 701 is sandwiched between the remaining portion of the fin structure 400B overlaid by the dummy gate structure 600 and a remaining portion of the fin structure 400B overlaid by another dummy gate structure (shown in dotted lines). Hereinafter, the remaining portion of the fin structure 400B overlaid by the dummy gate structure 600 is referred to as "first remaining portion of fin structure 400B." For example in FIG. 7D, trenches 711 are formed on the sides of the dummy gate structure 600 (and on the sides of the remaining portion of the fin structure 400C that is overlaid by the dummy gate structure 600). Each of the trenches 711 is sandwiched between the remaining portion of the fin structure 400C overlaid by the dummy gate structure 600 and a remaining portion of the fin structure 400C overlaid by another dummy gate structure (shown in dotted lines). Hereinafter, the remaining portion of the fin structure 400C overlaid by the dummy gate structure 600 is referred to as "first remaining portion of fin structure 400C."

Upon forming the trenches (e.g., 701, 711), inner spacers are formed along respective etched ends of the semiconductor layers 402. As shown in FIG. 7C, inner spacers 700 extend along respective etched ends of each of the semiconductor layers 402 in the first remaining portion of fin structure 400B; and as shown in FIG. 7D, inner spacers 710 extend along respective etched ends of each of the semiconductor layers 402 in the first remaining portion of fin structure 400C. The inner spacers 700 and 710 may be concurrently or respectively formed.

To form the inner spacers 700 and 710, respective end portions of each of the semiconductor layers 402 may first be removed. The end portions of the semiconductor layers 402 can be removed (e.g., etched) using a "pull-back" process to pull the semiconductor layers 402 back by an initial pull-back distance. In an example where the semiconductor layers 404 include Si, and the semiconductor layers 402 include $Si_{1-x}Ge_x$, the pull-back process may include a hydrogen chloride (HCl) gas isotropic etch process, which etches SiGe without attacking Si. As such, the Si layers 404 may remain intact during this process.

Next, the inner spacers 700 and 710 can be formed along the etched ends of each of the semiconductor layers 402. Thus, the inner spacers 700 and 710 (e.g., their respective inner sidewalls) may follow the profile of the etched ends of the semiconductor layers 402. In some embodiments, the inner spacers 700 and 710 can be formed conformally by chemical vapor deposition (CVD), or by monolayer doping (MLD) of nitride followed by spacer RIE. The inner spacers 700 and 710 can be deposited using, e.g., a conformal deposition process and subsequent isotropic or anisotropic etch back to remove excess spacer material on the sidewalls of the remaining portions of the fin structures (e.g., 400B, 400C) and on a surface of the semiconductor substrate 302. For example, the inner spacers 700 and 710 can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 8B:
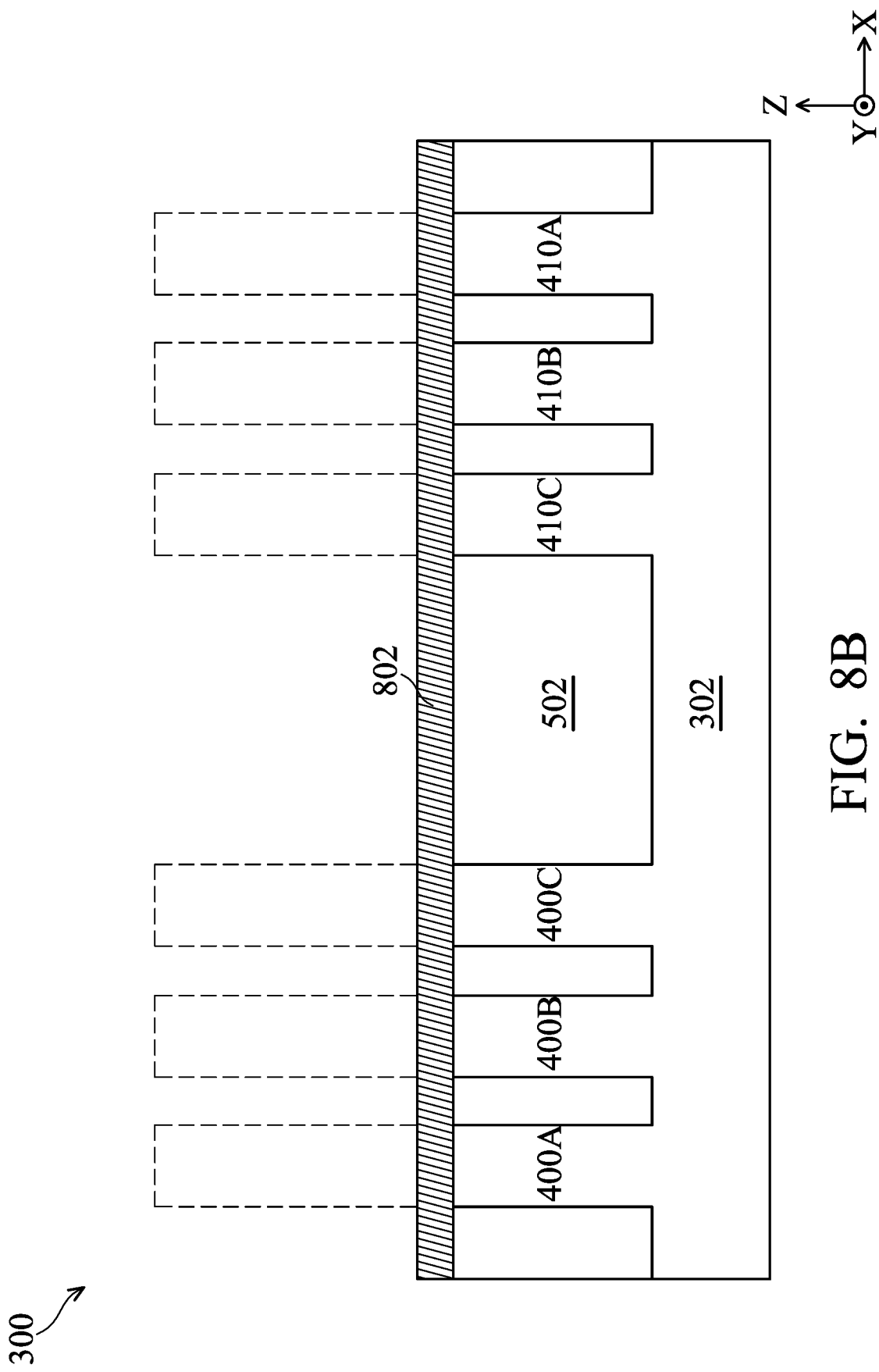
Figure 8C:
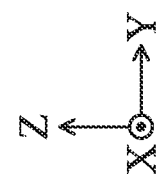
Figure 8C:
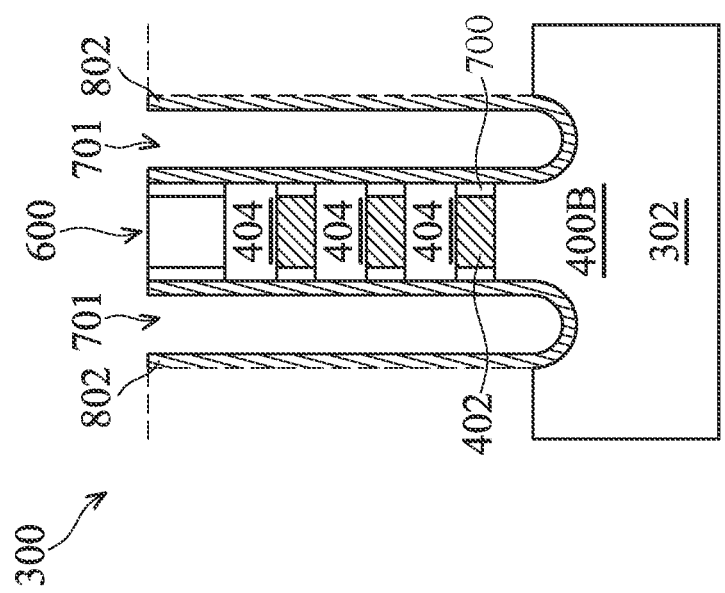
Figure 8D:
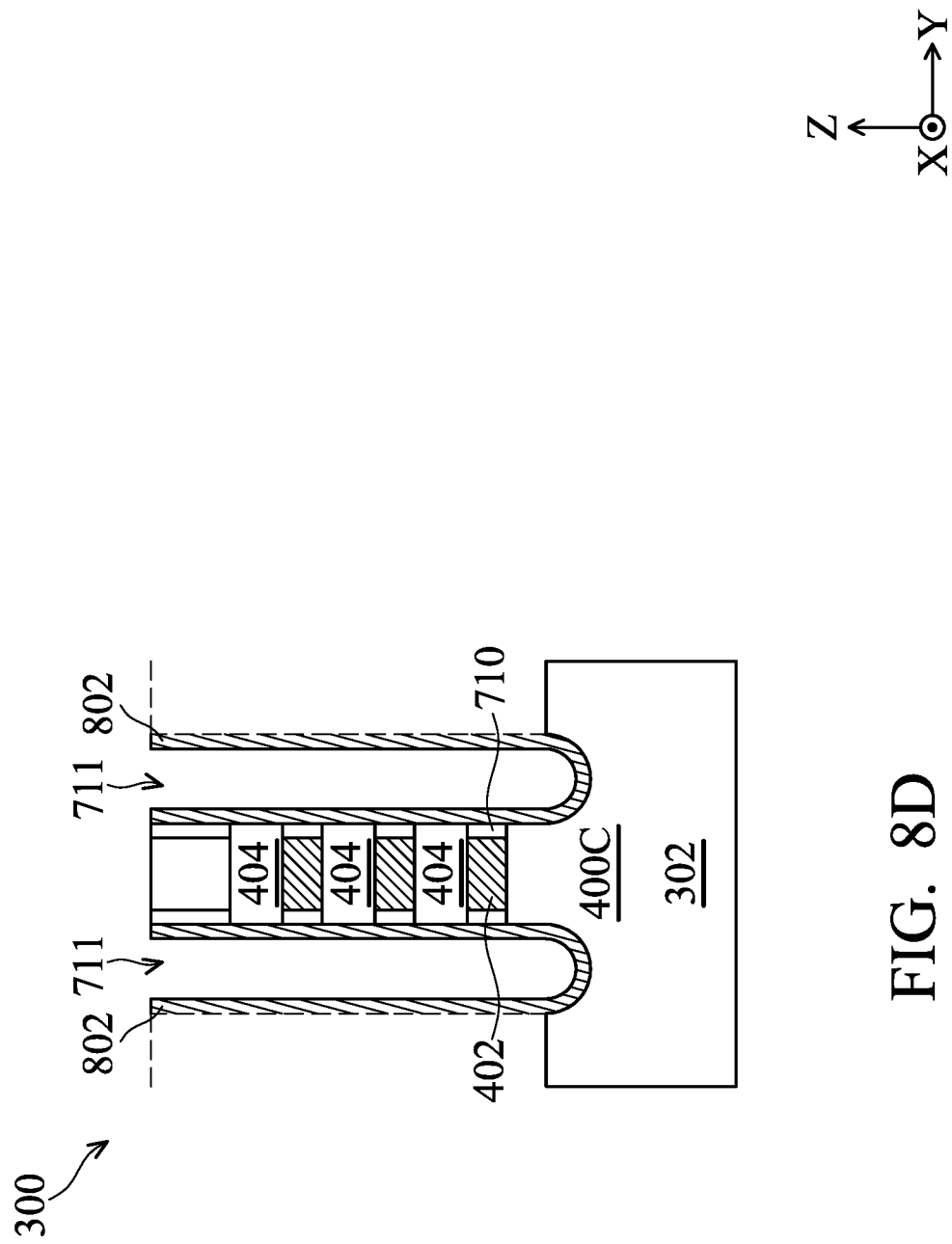

Corresponding to operation 212 of FIG. 2, FIG. 8A is a top view of the GAA FET device 300 including a passivation layer 802, at one of the various stages of fabrication. FIGS. 8B, 8C, and 8D are corresponding cross-sectional view of the GAA FET device 300. The cross-sectional view of FIG. 8B is cut in a direction parallel to the lengthwise direction of an active/dummy gate structure of the GAA FET device 300 (e.g., cross-section B-B indicated in FIG. 1); the cross-sectional view of FIG. 8C is cut in a direction along the lengthwise direction of a non-edge fin structure of the GAA FET device 300 (e.g., cross-section B-B indicated in FIG. 1); and the cross-sectional view of FIG. 8D is cut in a direction along the lengthwise direction of an edge fin structure of the GAA FET device 300 (e.g., cross-section B-B indicated in FIG. 1). As representative examples, FIG. 8C is cut along a lengthwise direction of the fin structure 400B; and FIG. 8D is cut along a lengthwise direction of the fin structure 400C.

As shown in FIGS. 8A-B, the passivation layer 802 can be (e.g., conformally) formed over the area where the etched portions of the fin structures 400A-C and 410A-C were located. For example, the passivation layer 802 overlays the intermediate surfaces of the fin structures 400A-C and 410A-C and the top surface of the isolation structure 502. Further, the passivation layer 802 can extend into (e.g., line) the trenches formed on the sides of each remaining portion of the fin structure 400B. As shown in FIG. 8C, the passivation layer 802 lines the trenches 701 formed on the sides of the first remaining portion of fin structure 400B.

The passivation layer 802 can line respective bottom surface and inner sidewalls of each of the trenches 701. In some embodiments, one inner sidewall of the trench 701 can be constituted by the sidewall of the first remaining portion of fin structure 400B. Specifically, such an inner sidewall includes respective exposed sidewalls of the inner spacers 700, respective exposed sidewalls of the semiconductor layers 404, and the exposed sidewall of the dummy gate structure 600. The other inner sidewall of the trench 701 can be constituted by the sidewall of another remaining portion of the fin structure 400B (shown in dotted lines) next to the shown first remaining portion of fin structure 400B, which can include the respective exposed sidewalls of inner spacers, the respective exposed sidewalls of semiconductor layers 404, and the exposed sidewall of a dummy gate structure. As shown in FIG. 8D, the passivation layer 802 lines the trenches 711 formed on the sides of the first remaining portion of fin structure 400C. The passivation layer 802 can line respective bottom surface and inner sidewalls of each of the trenches 711. In some embodiments, one inner sidewall of the trench 711 can be constituted by the sidewall of the first remaining portion of fin structure 400C. Specifically, such an inner sidewall includes respective exposed sidewalls of the inner spacers 710, respective exposed sidewalls of the semiconductor layers 404, and the exposed sidewall of the dummy gate structure 600. The other inner sidewall of the trench 711 can be constituted by the sidewall of another remaining portion of the fin structure 400C (shown in dotted lines) next to the shown first remaining portion of fin structure 400C, which can include the respective exposed sidewalls of inner spacers, the respective exposed sidewalls of semiconductor layers 404, and the exposed sidewall of a dummy gate structure.

In some other embodiments, the inner spacers 700 and 710 may be formed after forming (and patterning, which will be discussed below) the passivation layer 802. As such, one inner sidewall of the trench 701 may include respective exposed sidewalls of the semiconductor layers 402, respective exposed sidewalls of the semiconductor layers 404, and the exposed sidewall of the dummy gate structure 600; and the other inner sidewall of the trench 701 may include respective exposed sidewalls of the semiconductor layers 402 in an adjacent remaining portion of the fin structure 400B, respective exposed sidewalls of the semiconductor layers 404 in the adjacent remaining portion of the fin structure 400B, and the exposed sidewall of a dummy gate structure next to the dummy gate structure 600. Similarly, one inner sidewall of the trench 711 may include respective exposed sidewalls of the semiconductor layers 402, respective exposed sidewalls of the semiconductor layers 404, and the exposed sidewall of the dummy gate structure 600; and the other inner sidewall of the trench 711 may include respective exposed sidewalls of the semiconductor layers 402 in an adjacent remaining portion of the fin structure 400C, respective exposed sidewalls of the semiconductor layers 404 in the adjacent remaining portion of the fin structure 400C, and the exposed sidewall of a dummy gate structure next to the dummy gate structure 600.

The passivation layer 802 includes a material unfavorable for epitaxial growth, in some embodiments. As such, in a later stage of process where epitaxial growth is performed (e.g., when forming source/drain structures), the epitaxial growth can be significantly limited in the trenches where the passivation layer 802 still remains, e.g., trenches 711, which will be discussed below. In some embodiments, the passivation layer 802 can include one or more silicon-based dielectric materials such as, for example, silicon oxide, silicon nitride, silicon oxynitride, silicon carbide, silicon carbonitride, silicon oxycarbonitride, silicon oxycarbide, multilayers thereof, or combinations thereof, and may be deposited. In some embodiments, the passivation layer 802 can include one or more metal-based materials such as, for example, cobalt, tungsten, hafnium oxide, aluminum oxide, or combinations thereof, and may be deposited.

Figure 9B:
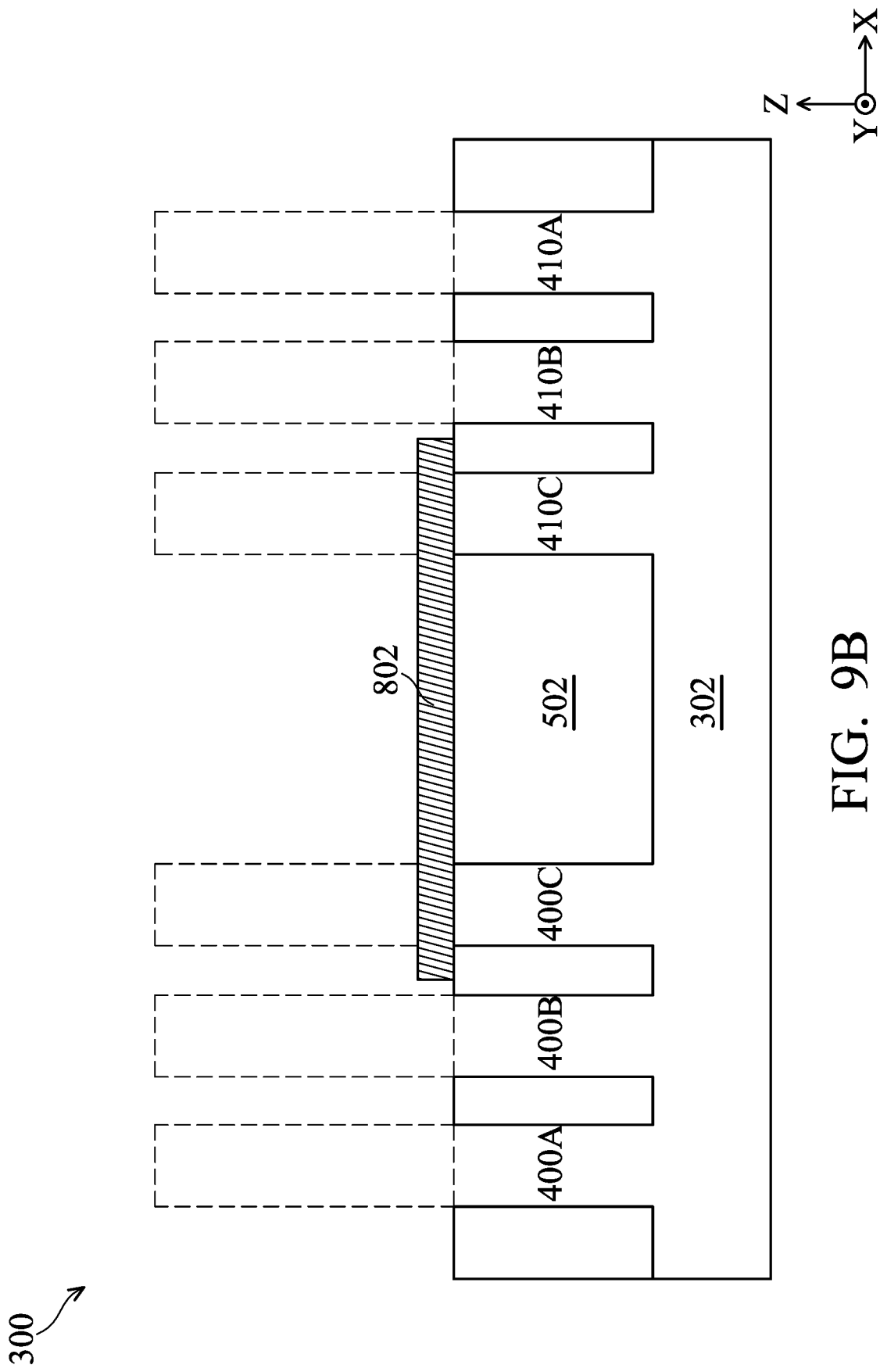
Figure 9C:
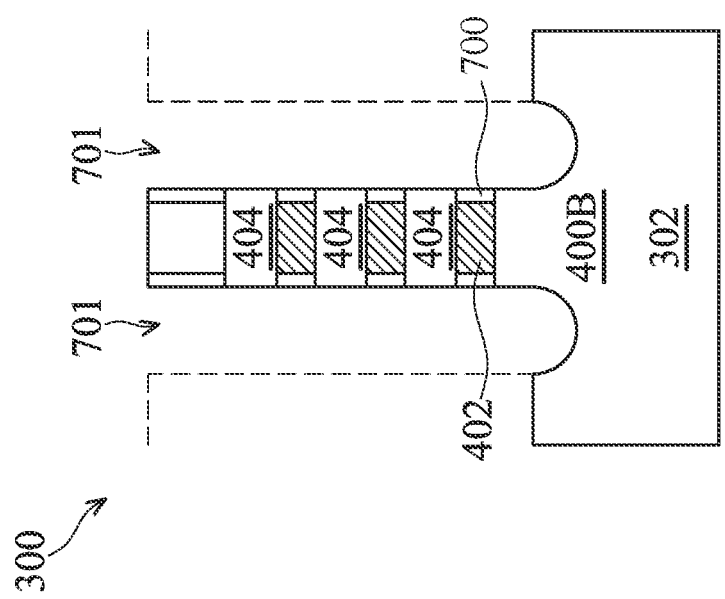
Figure 9D:
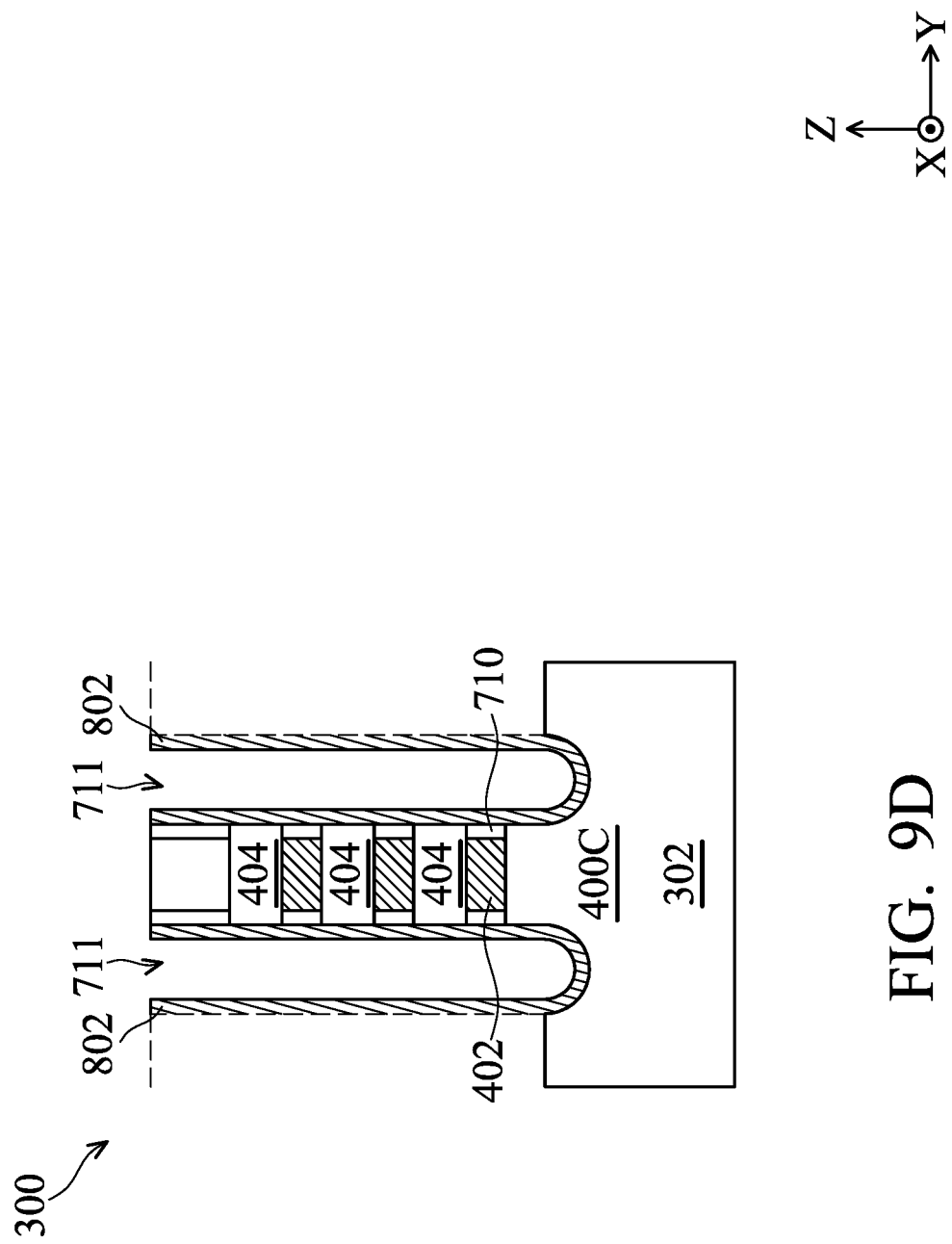

Corresponding to operation 214 of FIG. 2, FIG. 9A is a top view of the GAA FET device 300 in which the passivation layer 802 is patterned to selectively remain over the trenches in the edge fin structures, at one of the various stages of fabrication. FIGS. 9B, 9C, and 9D are corresponding cross-sectional view of the GAA FET device 300. The cross-sectional view of FIG. 9B is cut in a direction parallel to the lengthwise direction of an active/dummy gate structure of the GAA FET device 300 (e.g., cross-section B-B indicated in FIG. 1); the cross-sectional view of FIG. 9C is cut in a direction along the lengthwise direction of a non-edge fin structure of the GAA FET device 300 (e.g., cross-section B-B indicated in FIG. 1); and the cross-sectional view of FIG. 9D is cut in a direction along the lengthwise direction of an edge fin structure of the GAA FET device 300 (e.g., cross-section B-B indicated in FIG. 1). As representative examples, FIG. 9C is cut along a lengthwise direction of the fin structure 400B; and FIG. 9D is cut along a lengthwise direction of the fin structure 400C.

As shown in FIGS. 9A-B, the passivation layer 802 can be patterned (e.g., using photolithography and etching techniques) to remove from the area where the non-edge fin structures 400A-B and 410A-B are located. Alternatively, the passivation layer 802 may be formed over the area (as shown) by masking the non-edge fin structures 400A-B and 410A-B. Upon patterning the passivation layer 802, the passivation layer 802 may partially overlay the intermediate surfaces of the fin structures 400A-C and 410A-C and the top surface of the isolation structure 502. For example in FIG. 9B, the passivation layer 802 may remain over the area where the etched portions of the edge fin structures 400C and 410C were located. As further illustrated in FIG. 9C, the passivation layer 802 does not remain in the trenches 701. The sidewalls of the first remaining portion of fin structure 400B (and the sidewalls of the adjacent remaining portions of the fin structure 400B) may be re-exposed. As further illustrated in FIG. 9D, the passivation layer 802 remains lining the trench 711. In various embodiments, the remaining passivation layer 802 may have a conformal thickness in the range of about 3~300 angstroms (Å). The semiconductor layers 404 in each remaining portion of the edge fin structure 400C (including the shown "first remaining portion of fin structure 400C" and the adjacent remaining portions of the fin structure 400C (shown in dotted lines)) remain non-exposed. As such, the (epitaxial) growth of source/drain structures in the edge fin structure 400C can be significantly limited.

The main etch gas used to pattern the passivation layer 802 depends on the material of the passivation layer 802. A Si-based passivation layer may use $Cl_2$/HBr-based main etch gas, while a metal-based passivation layer may use $BCl_3$/$Cl_2$-based main etch gas. For etch of the passivation layer 802, the dry etch conditions for the passivation layer may include a main etch gas of $Cl_2$, HBr, $CF_4$, $CHF_3$, $CH_2F_2$, $CH_3F$, $C_4F_6$, $BCl_3$, $SF_6$, and/or $H_2$, for example. A passivation gas for tuning etch selectivity may include $N_2$, $O_2$, $CO_2$, $SO_2$, CO, and/or $SiCl_4$. A dilution gas may include at least one of Ar, He, or Ne, for example. The plasma source power may be between 100 watts (W) and 3000 W. The plasma bias power may be between 0 W and 3000 W. The pressure may be between 1 mTorr and 800 mTorr. The flow rate may be between 1 standard cubic centimeters per minute (sccm) and 5000 sccm. For a wet clean etch, the main etch chemical may include at least one of HF, $F_2$, or $H_3PO_4$, for example. An assisted etch chemical for selectivity tuning may include at least one of $O_3$, $H_2SO_4$, HCl, HBr, or $NH_3$. A solvent for the wet etch may include at least one of $D_1$ water, alcohol, or acetone.

Figure 10B:
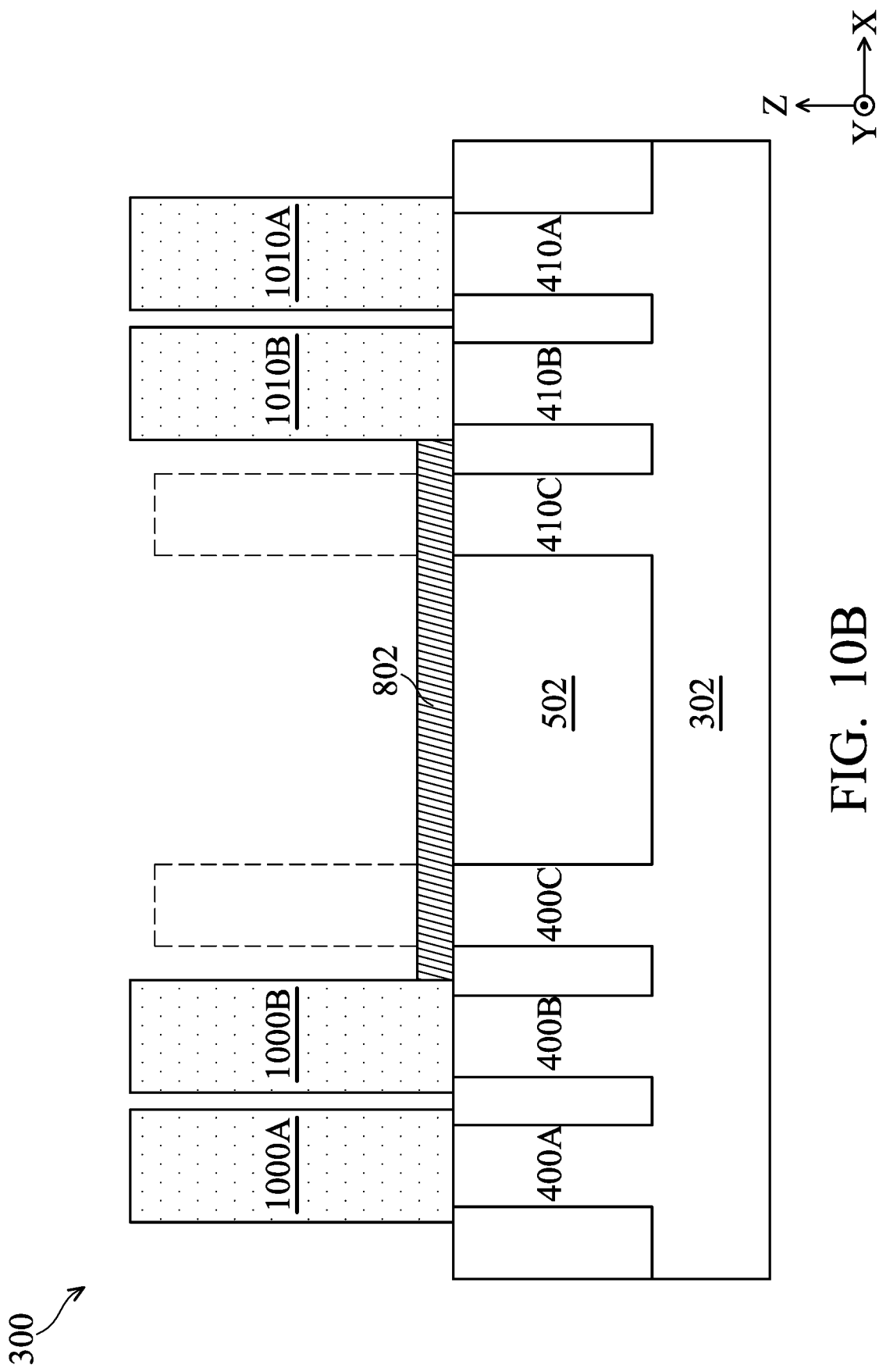
Figure 10C:
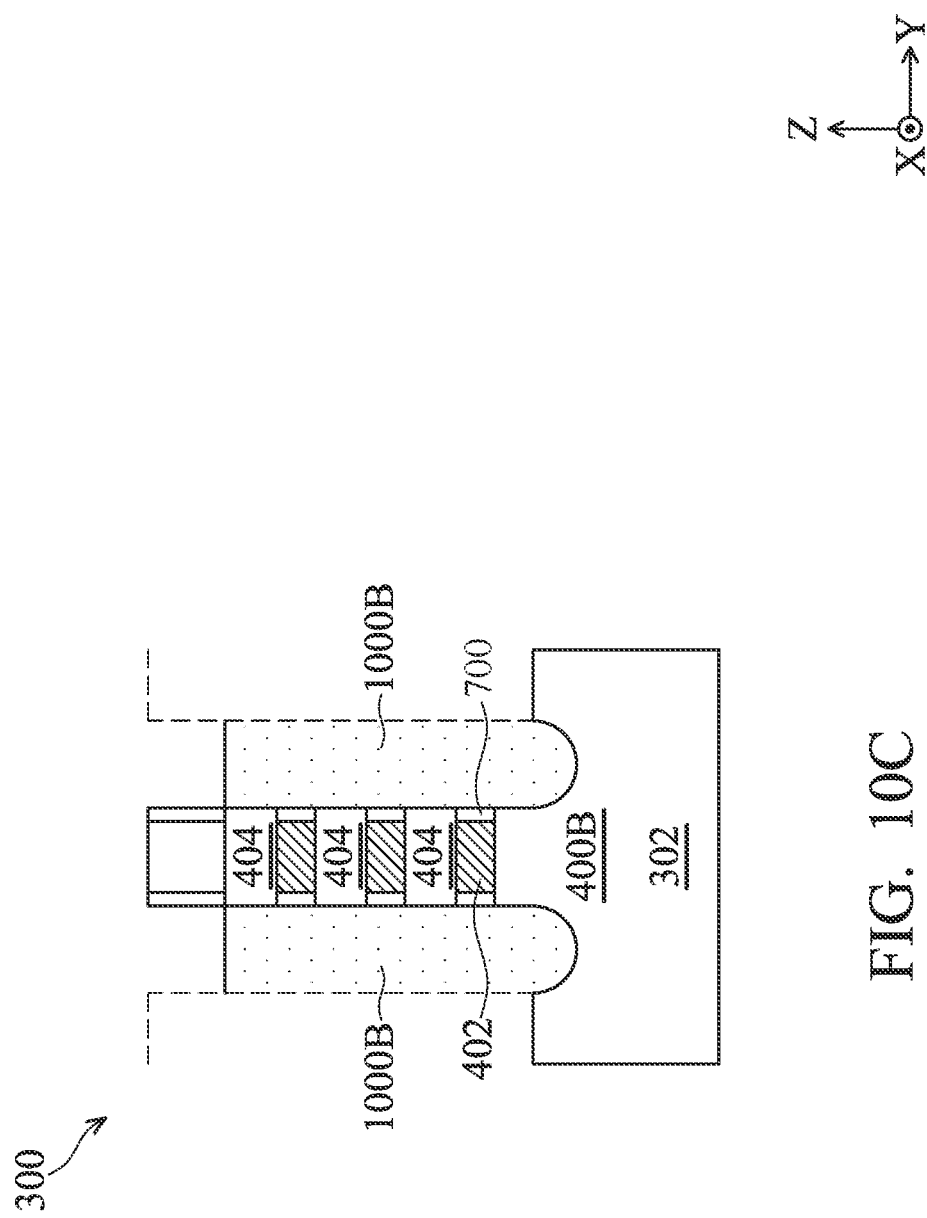
Figure 10D:
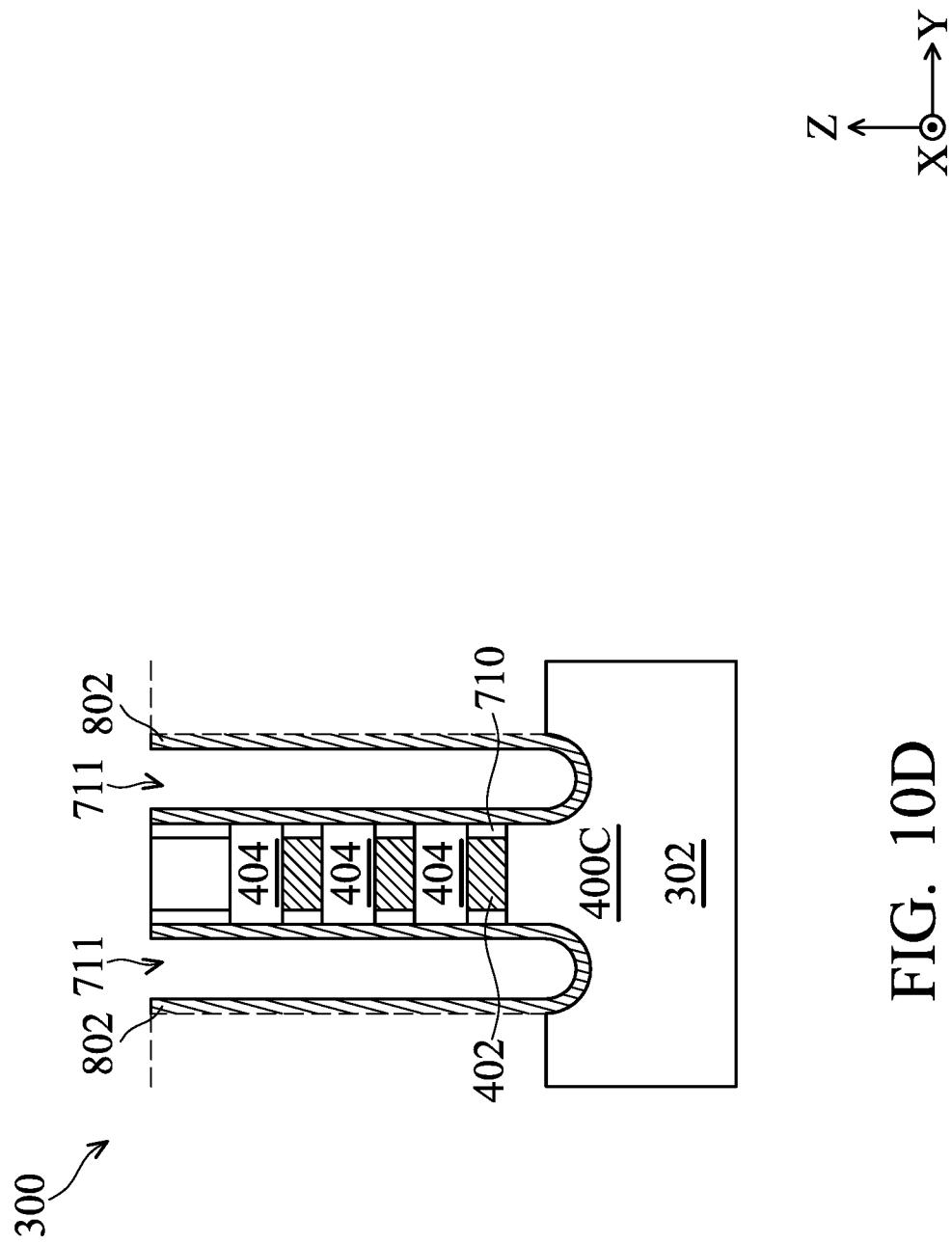

Corresponding to operation 216 of FIG. 2, FIG. 10A is a top view of the GAA FET device 300 including source/drain structures 1000A, 1000B, 1010A, and 1010B formed in the non-edge fin structures 400A, 400B, 410A, and 410B, respectively, at one of the various stages of fabrication. FIGS. 10B, 10C, and 10D are corresponding cross-sectional view of the GAA FET device 300. The cross-sectional view of FIG. 10B is cut in a direction parallel to the lengthwise direction of an active/dummy gate structure of the GAA FET device 300 (e.g., cross-section B-B indicated in FIG. 1); the cross-sectional view of FIG. 10C is cut in a direction along the lengthwise direction of a non-edge fin structure of the GAA FET device 300 (e.g., cross-section B-B indicated in FIG. 1); and the cross-sectional view of FIG. 10D is cut in a direction along the lengthwise direction of an edge fin structure of the GAA FET device 300 (e.g., cross-section B-B indicated in FIG. 1). As representative examples, FIG. 10C is cut along a lengthwise direction of the fin structure 400B; and FIG. 10D is cut along a lengthwise direction of the fin structure 400C.

The source/drain structures 1000A-B and 1010A-B may be formed using an epitaxial layer growth process on exposed ends (sidewalls) of each of the semiconductor layers 404 in the non-edge fin structures 400A-B and 410A-B. In some embodiments, a bottom surface of the source/drain structures 1000A-B and 1010A-B may be leveled with the top surface of the isolation structure 502, as shown in FIG. 10B. In some other embodiments, the bottom surface of the source/drain structures 1000A-B and 1010A-B may be lower than the top surface of the isolation structure 502. The source/drain structures (e.g., 1000A and 1000B, 1010A and 1010B) in the adjacent fin structures may merge with each other. On the other hand, in some embodiments, a top surface of the source/drain structures 1000A-B and 1010A-B may be higher than a top surface of the topmost semiconductor layers 404 in the non-edge fin structures 400A-B and 410A-B, as shown in FIG. 10C where the fin structure 400B is shown. In some other embodiments, the top surface of the source/drain structures 1000A-B and 1010A-B may be leveled with or lower than the top surface of the topmost semiconductor layers 404.

The source/drain structures 1000A-B and 1010A-B are electrically coupled to the respective semiconductor layers 404 of the non-edge fin structures 400A-B and 410A-B. As such, the semiconductor layers 404 of each of the non-edge fin structures 400A-B and 410A-B may collectively function as the "active" channel of a GAA transistor that conducts current flowing between its respective source/drain structures. However, it should be noted that at this stage of fabrication, those active GAA transistors are not finished yet. As the semiconductor layers 404 of the edge fin structures 400C and 410C remain overlaid by the passivation layer 802, no source/drain structures can be formed in the edge fin structures 400C and 410C. As such, the semiconductor layers 404 of each of the edge fin structures 400C and 410C may collectively function as the "inactive" channel of a GAA transistor that does not conduct current.

In-situ doping (ISD) may be applied to form doped source/drain structures 1000A-B and 1010A-B, thereby creating the junctions for the GAA transistors. N-type and p-type FETs are formed by implanting different types of dopants to selected regions (e.g., the source/drain structures 1000A-B and 1010A-B) of the device to form the junction(s). N-type devices can be formed by implanting arsenic (As) or phosphorous (P), and p-type devices can be formed by implanting boron (B).

Figure 11A:
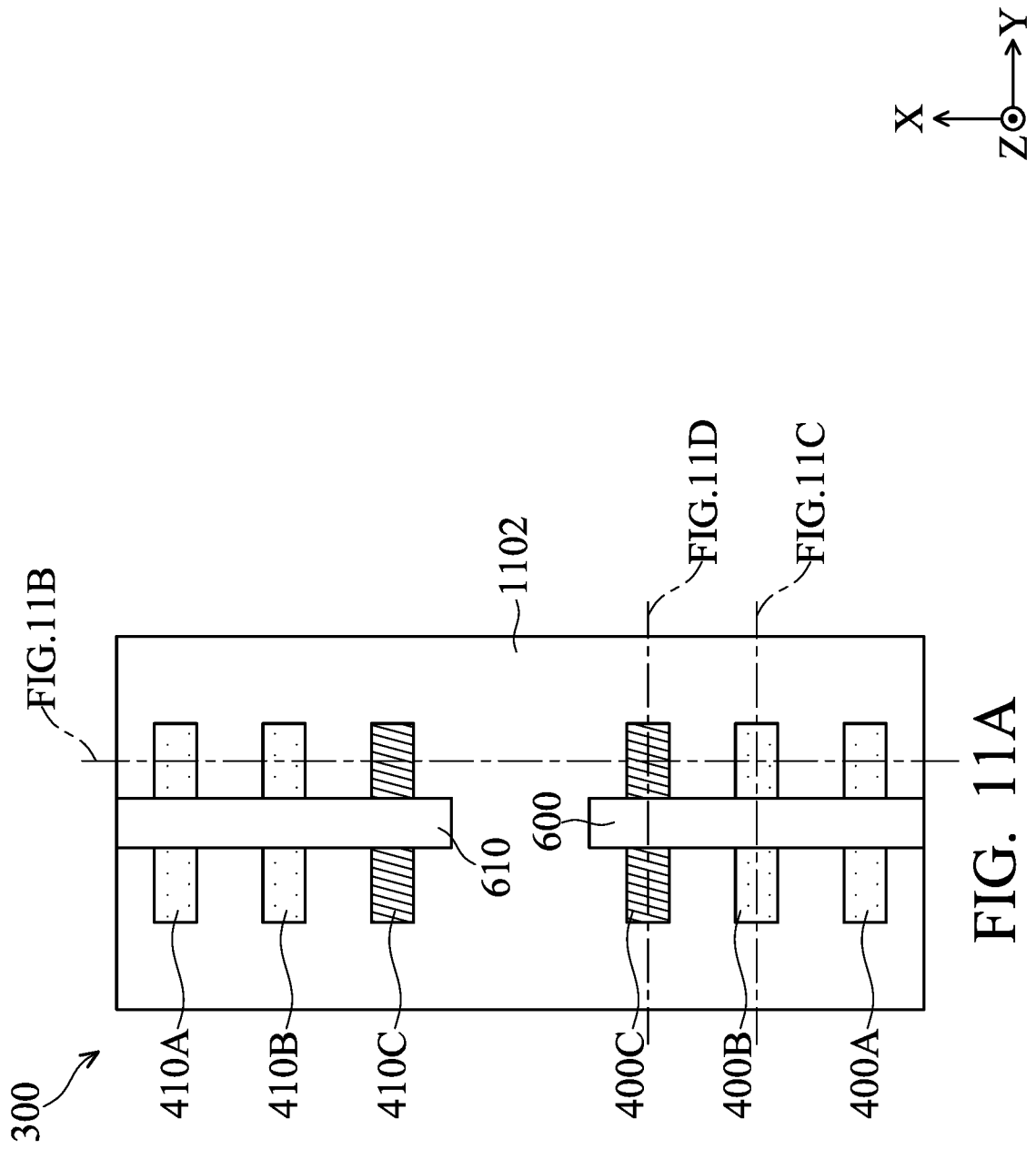
Figure 11B:
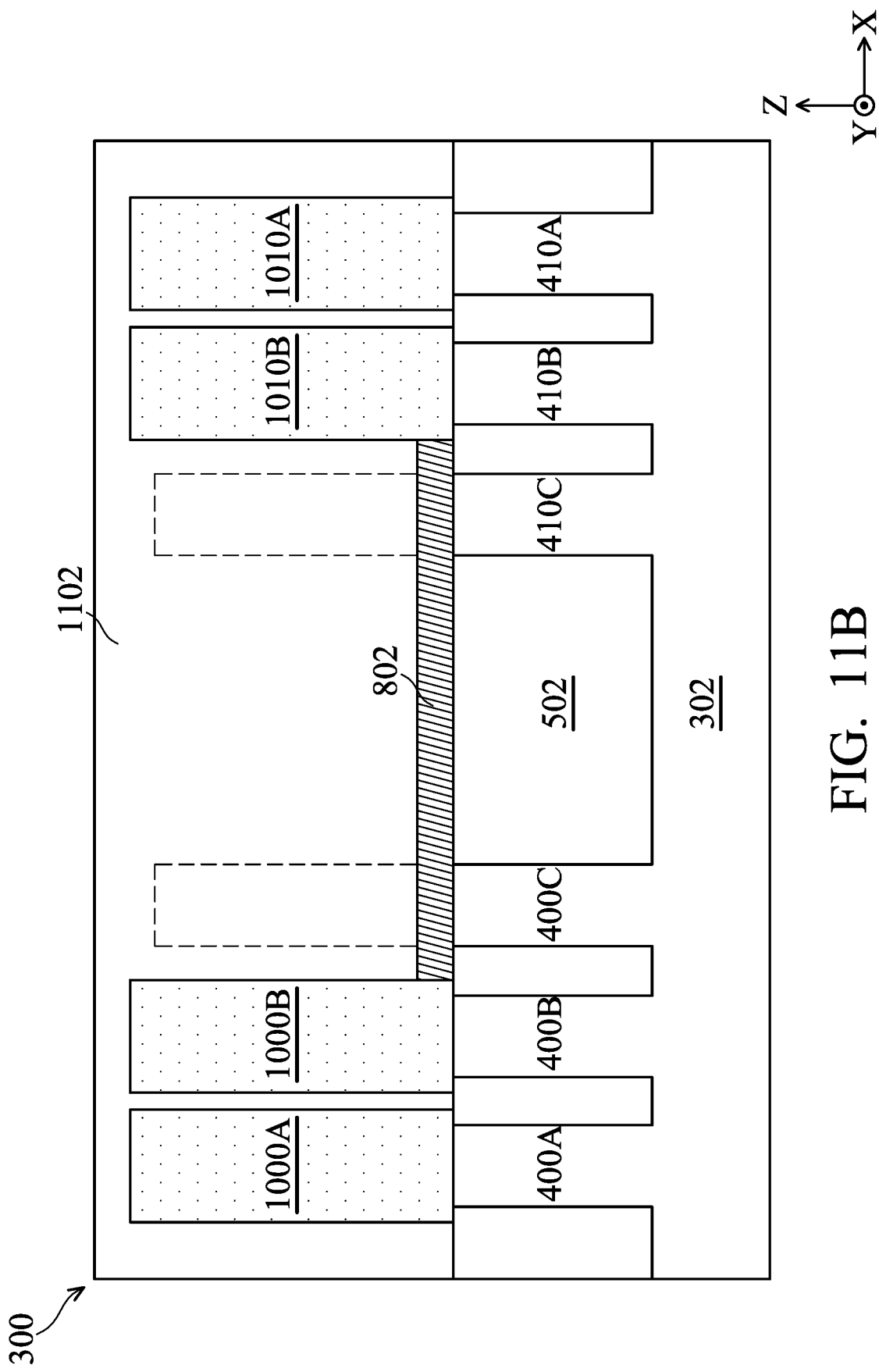
Figure 11C:
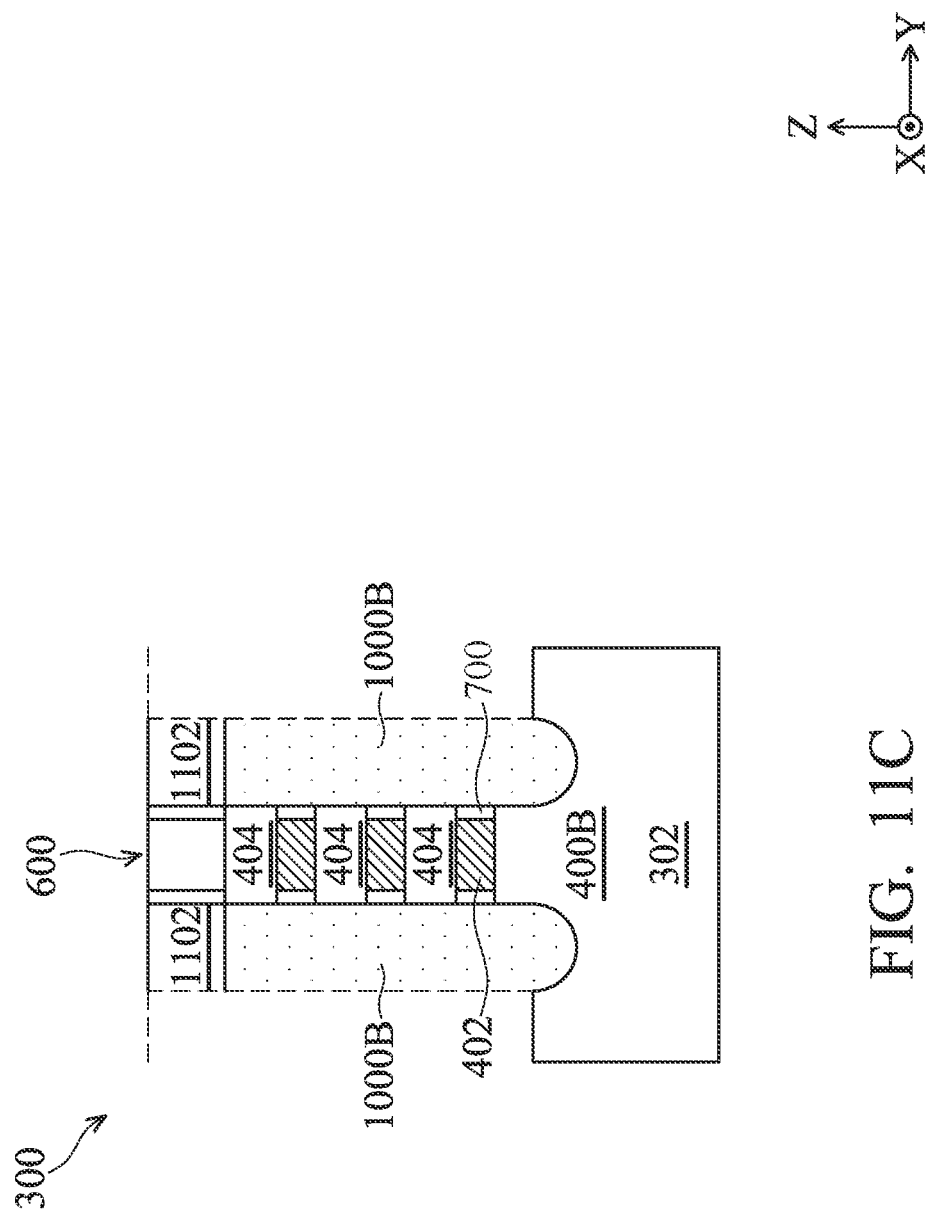
Figure 11D:
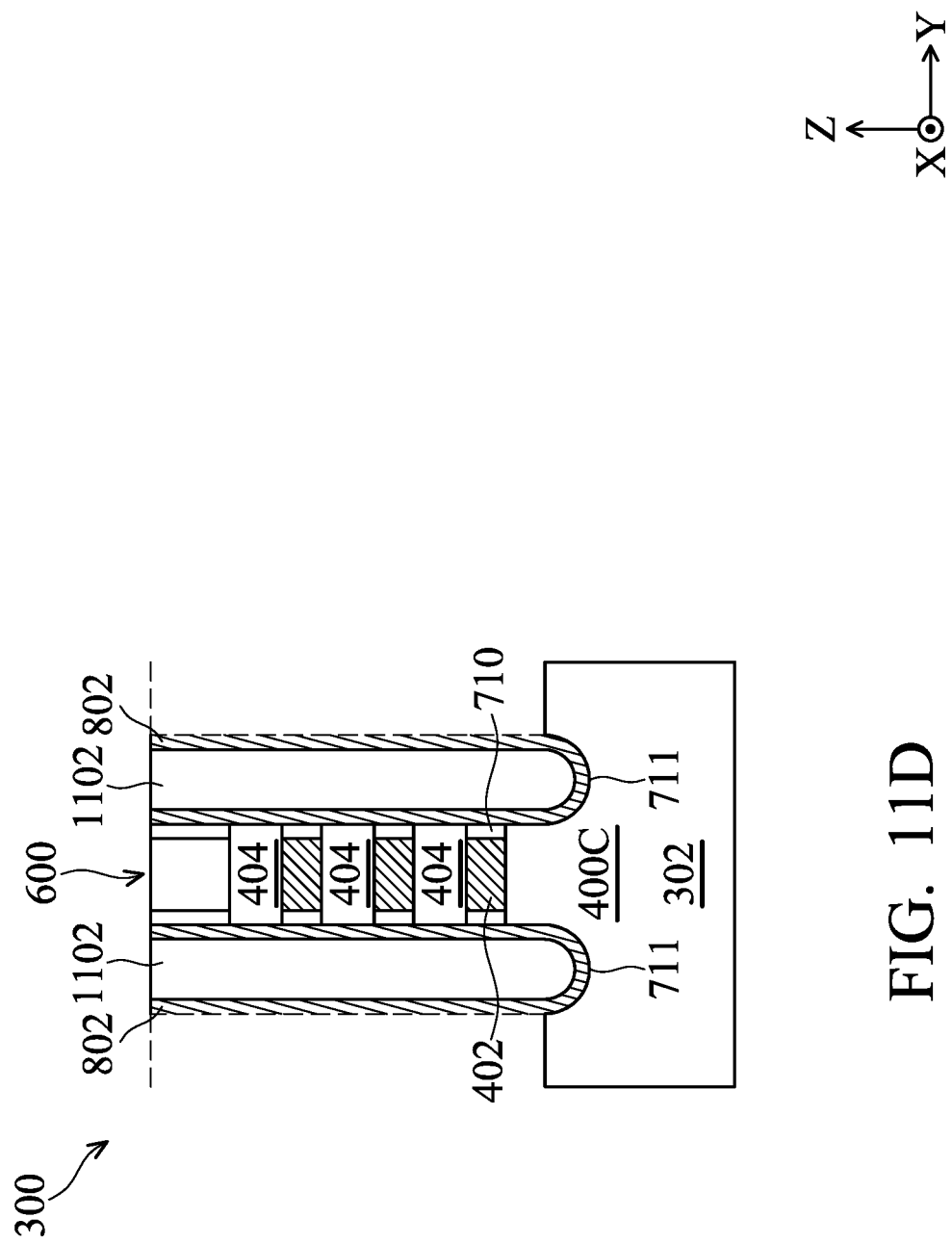

Corresponding to operation 218 of FIG. 2, FIG. 11A is a top view of the GAA FET device 300 including an interlayer dielectric (ILD) 1102, at one of the various stages of fabrication. FIGS. 11B, 11C, and 11D are corresponding cross-sectional view of the GAA FET device 300. The cross-sectional view of FIG. 11B is cut in a direction parallel to the lengthwise direction of an active/dummy gate structure of the GAA FET device 300 (e.g., cross-section B-B indicated in FIG. 1); the cross-sectional view of FIG. 11C is cut in a direction along the lengthwise direction of a non-edge fin structure of the GAA FET device 300 (e.g., cross-section B-B indicated in FIG. 1); and the cross-sectional view of FIG. 11D is cut in a direction along the lengthwise direction of an edge fin structure of the GAA FET device 300 (e.g., cross-section B-B indicated in FIG. 1). As representative examples, FIG. 11C is cut along a lengthwise direction of the fin structure 400B; and FIG. 11D is cut along a lengthwise direction of the fin structure 400C.

Upon forming the source/drain structures 1000A-B and 1010A-B, the ILD 1102 can be formed by depositing a dielectric material in bulk over the workpiece, and polishing the bulk oxide back (e.g., using CMP) to the level of the dummy gate structures 600 and 610, as illustrated in FIGS. 11C-D. Specifically, the ILD 1102 may overlay the source/drain structures formed in the non-edge fin structures (see, e.g., FIG. 11C); and the ILD 1102 may fill the trenches formed in the edge fin structures, with the passivation layer 802 formed therebetween (see, e.g., FIG. 11D). As such, the semiconductor layers 404 of the edge fin structures are each coupled with one or more dielectric trenches, with the passivation layer sandwiched therebetween. The dielectric material of ILD 1102 includes silicon oxide, phosphosilicate glass (PSG), borosilicate glass (BSG), boron-doped phosphosilicate Glass (BPSG), undoped silicate glass (USG), or combinations thereof.

Figure 12B:
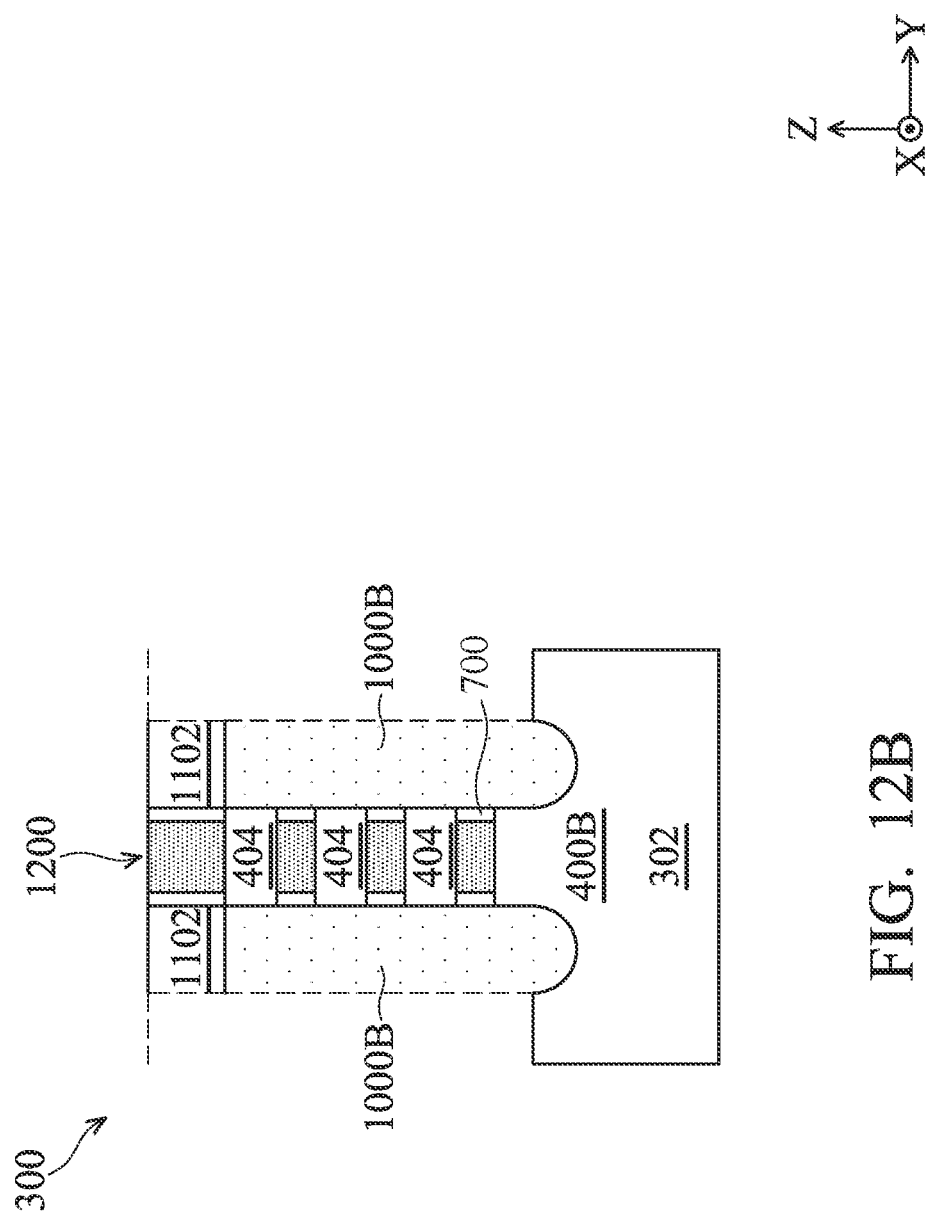
Figure 12C:
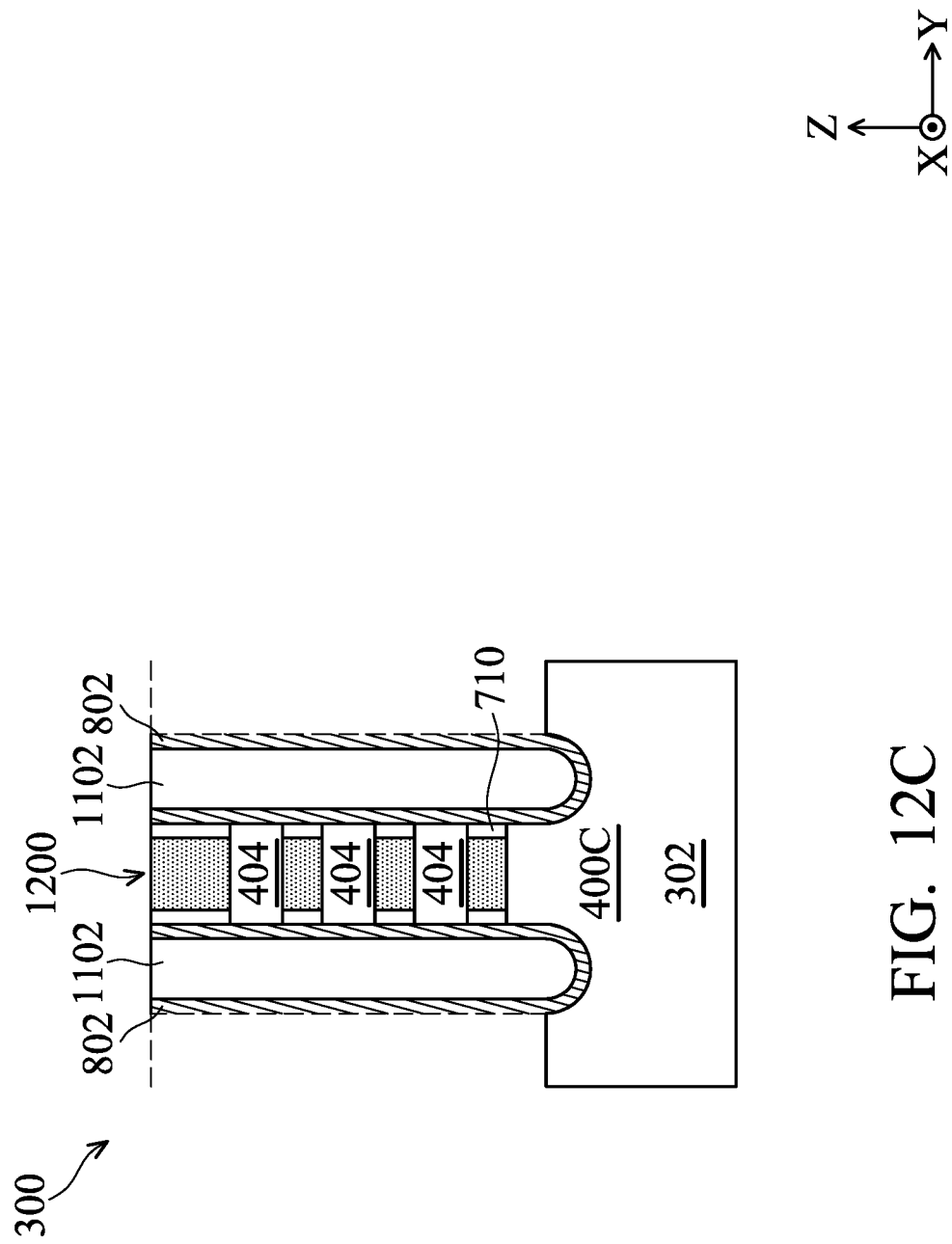

Corresponding to operation 220 of FIG. 2, FIG. 12A is a top view of the GAA FET device 300 including active gate structures 1200 and 1210, at one of the various stages of fabrication. FIGS. 12B and 12C are corresponding cross-sectional view of the GAA FET device 300. The cross-sectional view of FIG. 12B is cut in a direction along the lengthwise direction of a non-edge fin structure of the GAA FET device 300 (e.g., cross-section B-B indicated in FIG. 1); and the cross-sectional view of FIG. 12C is cut in a direction along the lengthwise direction of an edge fin structure of the GAA FET device 300 (e.g., cross-section B-B indicated in FIG. 1). As representative examples, FIG. 12B is cut along a lengthwise direction of the fin structure 400B; and FIG. 12C is cut along a lengthwise direction of the fin structure 400C.

To form the active gate structures 1200 and 1210, the dummy gate structures 600-610 and the semiconductor layers 402 of the edge and non-edge fin structures can be removed respectively or concurrently, while leaving the semiconductor layers 404 substantially intact. After the removal of the dummy gate structures 600-610, a gate trench, exposing respective sidewalls of each of the semiconductor layers 404 that face the X direction, may be formed. After the removal of the semiconductor layers 402 to further extend the gate trench, respective bottom surface and/or top surface of each of the semiconductor layers 404 may be exposed. Consequently, a full circumference of each of the semiconductor layers 404 can be exposed. Next, the active gate structures 1200 and 1210 are formed to wrap around each of the semiconductor layers 404.

The active gate structure 1200 and 1210 each include a gate dielectric and a gate metal, in some embodiments. The gate dielectric can wrap around each of the semiconductor layers 404 (e.g., the top and bottom surfaces and sidewalls facing the X direction). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the semiconductor layers 404.

The gate metal can wrap around each of the semiconductor layers 404 with the gate dielectric disposed therebetween. Specifically, the gate metal can include a number of gate metal sections abutted to each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin together to wrap around a corresponding one of the semiconductor layers 404, with the gate dielectric disposed therebetween.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

In one aspect of the present disclosure, a semiconductor device is disclosed. The semiconductor device includes a first stack structure including a first plurality of semiconductor layers vertically spaced from one another. The semiconductor device includes a second stack structure including a second plurality of semiconductor layers vertically spaced from one another. The semiconductor device includes a third stack structure including a third plurality of semiconductor layers vertically spaced from one another. The first, second, and third stack structures all extend along a first lateral direction. The second stack structure is disposed between the first and third stack structures. The semiconductor device includes a first gate structure that extends along a second lateral direction perpendicular to the first lateral direction and wraps around each of the first plurality of semiconductor layers, each of the second plurality of semiconductor layers, and each of the third plurality of semiconductor layers. Ends of each of the first plurality of semiconductor layers are coupled with respective source/drain structures, ends of each of the second plurality of semiconductor layers are coupled with respective source/drain structures, and ends of each of the third plurality of semiconductor layers are coupled with a dielectric passivation layer.

In another aspect of the present disclosure, a semiconductor device is disclosed. The semiconductor device includes a substrate. The semiconductor device includes a first stack structure, a second stack structure, a third stack structure, a fourth stack structure, a fifth stack structure, and a sixth stack structure formed over the substrate. The first through sixth stack structures all extend along a first lateral direction. The second stack structure is separated from each of the first and third stack structures with a first distance, the fifth stack structure is separated from each of the fourth and sixth stack structures with the first distance. The third stack structure is separated from the fourth stack structure with a second distance, and wherein the second distance is greater than the first distance. The semiconductor device includes first source/drain structures coupled to respective ends of an upper portion of the first stack structure. The semiconductor device includes second source/drain structures coupled to respective ends of an upper portion of the second stack structure. The semiconductor device includes first dielectric trenches coupled to respective ends of an upper portion of the third stack structure. The semiconductor device includes second dielectric trenches coupled to respective ends of an upper portion of the fourth stack structure. The semiconductor device includes third source/drain structures coupled to respective ends of an upper portion of the fifth stack structure. The semiconductor device includes fourth source/drain structures coupled to respective ends of an upper portion of the sixth stack structure.

In yet another aspect of the present disclosure, a method for fabricating a semiconductor device is disclosed. The method includes forming a first fin structure, a second fin structure, a third fin structure, a fourth fin structure, a fifth fin structure, and a sixth fin structure formed over a substrate. The first through sixth fin structures all extend along a first lateral direction. The second fin structure is separated from each of the first and third fin structures with a first distance, the fifth fin structure is separated from each of the fourth and sixth fin structures with the first distance, and the third fin structure is separated from the fourth fin structure with a second distance. The second distance is greater than the first distance. The method includes forming one or more gate structures overlaying a respective portion of each of the first through six fin structures. The method includes forming a first pair of trenches, a second pair of trenches, a third pair of trenches, a fourth pair of trenches, a fifth pair of trenches, and a sixth pair of trenches by removing respective portions of each of the first through six fin structures that are not overlaid by the one or more gate structures. The method includes forming a dielectric passivation layer over the third and fourth pairs of trenches. The method includes growing source/drain structures in the first, second, fifth, and sixth pairs of trenches, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first stack structure including a first plurality of semiconductor layers vertically spaced from one another;
   a second stack structure including a second plurality of semiconductor layers vertically spaced from one another;
   a third stack structure including a third plurality of semiconductor layers vertically spaced from one another, wherein the first, second, and third stack structures all extend along a first lateral direction, wherein the second stack structure is disposed between the first and third stack structures along a second lateral direction perpendicular to the first lateral direction; and
   a first gate structure that extends along the second lateral direction and wraps around each of the first plurality of semiconductor layers, each of the second plurality of semiconductor layers, and each of the third plurality of semiconductor layers, and
   wherein ends of each of the first plurality of semiconductor layers are coupled with respective source/drain structures, ends of each of the second plurality of semiconductor layers are coupled with respective source/drain structures, and ends of each of the third plurality of semiconductor layers are coupled with a dielectric passivation layer.

2. The semiconductor device of claim 1, further comprising:
   a fourth stack structure including a fourth plurality of semiconductor layers vertically spaced from one another;
   a fifth stack structure including a fifth plurality of semiconductor layers vertically spaced from one another; and a sixth stack structure including a sixth plurality of semiconductor layers vertically spaced from one another, wherein the fourth, fifth, and sixth stack structures all extend along the first lateral direction, wherein the fifth stack structure is disposed between the fourth and sixth stack structures, and wherein the third and fourth stack structures are separated with a distance along the second lateral direction, wherein ends of each of the fourth plurality of semiconductor layers are coupled with the dielectric passivation layer, ends of each of the fifth plurality of semiconductor layers are coupled with respective source/drain structures, and ends of each of the sixth plurality of semiconductor layers are coupled with respective source/drain structures.

3. The semiconductor device of claim 2, wherein the distance ranges from about 10 nanometers to about 3000 nanometers.

4. The semiconductor device of claim 2, further comprising a second gate structure that extends along the second lateral direction and wraps around each of the fourth plurality of semiconductor layers, each of the fifth plurality of semiconductor layers, and each of the sixth plurality of semiconductor layers.

5. The semiconductor device of claim 4, wherein the second gate structure is offset from the first gate structure along the first lateral direction.

6. The semiconductor device of claim 4, wherein the first gate structure has a first width along the first lateral direction and the second gate structure has a second width along the first lateral direction, and wherein the first width is different from the second width.

7. The semiconductor device of claim 4, wherein the first gate structure and the second gate structure are integrally formed as a single piece.

8. The semiconductor device of claim 4, wherein the first gate structure and the second gate structure are coupled to each other via a gate isolation structure.

9. The semiconductor device of claim 1, wherein the ends of each of the third plurality of semiconductor layers are coupled to an interlayer dielectric, with the dielectric passivation layer coupled therebetween.

10. A semiconductor device, comprising:
a substrate;
a first stack structure, a second stack structure, a third stack structure, a fourth stack structure, a fifth stack structure, and a sixth stack structure formed over the substrate, wherein the first through sixth stack structures all extend along a first lateral direction, wherein the second stack structure is separated from each of the first and third stack structures with a first distance along a second lateral direction perpendicular to the first lateral direction, the fifth stack structure is separated from each of the fourth and sixth stack structures with the first distance along the second lateral direction, and the third stack structure is separated from the fourth stack structure with a second distance along the second lateral direction, and wherein the second distance is greater than the first distance;
first source/drain structures coupled to respective ends of an upper portion of the first stack structure;
second source/drain structures coupled to respective ends of an upper portion of the second stack structure;
first dielectric trenches coupled to respective ends of an upper portion of the third stack structure;
second dielectric trenches coupled to respective ends of an upper portion of the fourth stack structure;
third source/drain structures coupled to respective ends of an upper portion of the fifth stack structure; and
fourth source/drain structures coupled to respective ends of an upper portion of the sixth stack structure.

11. The semiconductor device of claim 10, wherein the first distance ranges from about 5 nanometers to about 300 nanometers.

12. The semiconductor device of claim 10, wherein the second distance ranges from about 10 nanometers to about 3000 nanometers.

13. The semiconductor device of claim 10, wherein each of the first through sixth stack structures includes a plurality of semiconductor layers that are vertically spaced from one another.

14. The semiconductor device of claim 10, further comprising:
a first gate structure that extends along the second lateral direction and is disposed over the first through third stack structures; and
a second gate structure that extends along the second lateral direction and is disposed over the fourth through sixth stack structures.

15. The semiconductor device of claim 14, wherein the second gate structure is offset from the first gate structure along the first lateral direction.

16. The semiconductor device of claim 14, wherein the first gate structure has a first width along the first lateral direction and the second gate structure has a second width along the first lateral direction, and wherein the first width is different from the second width.

17. The semiconductor device of claim 14, wherein the first gate structure and the second gate structure are integrally formed as a single piece.

18. A semiconductor device, comprising:
a substrate;
a first stack structure, a second stack structure, a third stack structure, a fourth stack structure, a fifth stack structure, and a sixth stack structure formed over the substrate, wherein the first through sixth stack structures all extend along a first lateral direction, wherein the second stack structure is interposed between the first and third stack structures along a second lateral direction perpendicular to the first lateral direction, the fifth stack structure is interposed between the fourth and sixth stack structures along the second lateral direction, and the third stack structure is separated from the fourth stack structure along the second lateral direction;
a first gate structure that extends along the second lateral direction and wraps around each of the first to third stack structures;
a second gate structure that extends along the second lateral direction and wraps around each of the fourth to sixth stack structures;
first source/drain structures coupled to respective ends of an upper portion of the first stack structure;
second source/drain structures coupled to respective ends of an upper portion of the second stack structure;
first dielectric trenches coupled to respective ends of an upper portion of the third stack structure;
second dielectric trenches coupled to respective ends of an upper portion of the fourth stack structure;
third source/drain structures coupled to respective ends of an upper portion of the fifth stack structure; and
fourth source/drain structures coupled to respective ends of an upper portion of the sixth stack structure.

19. The semiconductor device of claim 18, wherein the third and fourth stack structures are separated from each other with a distance along the second lateral direction.

20. The semiconductor device of claim 19, wherein the distance ranges from about 10 nanometers to about 3000 nanometers.

* * * * *